US012557629B2

(12) United States Patent
Chang et al.

(10) Patent No.: US 12,557,629 B2
(45) Date of Patent: Feb. 17, 2026

(54) INTERCONNECT STRUCTURE AND METHODS OF FORMING THE SAME

(71) Applicant: TAIWAN SEMICONDUCTOR MANUFACTURING COMPANY, LTD., Hsinchu (TW)

(72) Inventors: Chien Chang, Hsinchu (TW); Yen-Chun Lin, Hsinchu (TW); Jen-Wei Liu, Taipei (TW); Chih-Han Tseng, Tainan (TW); Harry Chien, Chandler, AZ (US); Cheng-Hui Weng, Hsinchu (TW); Chun-Chieh Lin, Taichung (TW); Hung-Wen Su, Hsinchu (TW); Ming-Hsing Tsai, Chu-Pei (TW); Chih-Wei Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 404 days.

(21) Appl. No.: 18/220,886

(22) Filed: Jul. 12, 2023

(65) Prior Publication Data

US 2024/0312901 A1 Sep. 19, 2024

Related U.S. Application Data

(60) Provisional application No. 63/453,083, filed on Mar. 18, 2023.

(51) Int. Cl.
*H01L 23/522* (2006.01)
*H01L 21/768* (2006.01)
(Continued)

(52) U.S. Cl.
CPC .... *H01L 23/5226* (2013.01); *H01L 21/76802* (2013.01); *H01L 21/76834* (2013.01);
(Continued)

(58) Field of Classification Search
CPC .......... H01L 23/5226; H01L 21/76802; H01L 21/76834; H01L 21/76846; H01L 21/7685;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

KR 20160051376 5/2016
KR 20180102887 9/2018
KR 20220163117 12/2022

*Primary Examiner* — Karen Kusumakar
(74) *Attorney, Agent, or Firm* — NZ Carr Law Office

(57) ABSTRACT

An interconnect structure including a contact via in an interlayer dielectric, a first conductive feature in a first dielectric layer, the first dielectric layer over the interlayer dielectric, a first liner in the first dielectric layer, the first liner comprising a first part in contact with a sidewall surface of the first conductive feature, and a second part in contact with a bottom surface of the first conductive feature. The interconnect structure includes a first cap layer in contact with a top surface of the first conductive feature, a second conductive feature in a second dielectric layer, the second dielectric layer over the first dielectric layer, a second liner in the second dielectric layer, wherein the first and second conductive features comprise a first conductive material, and the contact via, first liner, first cap layer, and second liner comprise a second conductive material chemically different than the first conductive material.

20 Claims, 14 Drawing Sheets

(51) Int. Cl.
  *H01L 23/532*  (2006.01)
  *H10D 64/23*  (2025.01)

(52) U.S. Cl.
  CPC .... *H01L 21/76846* (2013.01); *H01L 21/7685* (2013.01); *H01L 21/76877* (2013.01); *H01L 23/53238* (2013.01); *H10D 64/251* (2025.01)

(58) Field of Classification Search
  CPC ......... H01L 21/76877; H01L 23/53238; H01L 21/76849; H01L 23/53209; H01L 23/5283; H01L 23/5286; H01L 23/535; H10D 64/251; H10D 84/0149
  See application file for complete search history.

(56) References Cited

U.S. PATENT DOCUMENTS

| | | |
|---|---|---|
| 9,236,300 B2 | 1/2016 | Liaw |
| 9,406,804 B2 | 8/2016 | Huang et al. |
| 9,443,769 B2 | 9/2016 | Wang et al. |
| 9,520,482 B1 | 12/2016 | Chang et al. |
| 9,548,366 B1 | 1/2017 | Ho et al. |
| 9,576,814 B2 | 2/2017 | Wu et al. |
| 9,831,183 B2 | 11/2017 | Lin et al. |
| 9,859,386 B2 | 1/2018 | Ho et al. |
| 2017/0186682 A1* | 6/2017 | Anderson ......... H01L 21/31053 |
| 2021/0057273 A1 | 2/2021 | Chen et al. |
| 2021/0287994 A1* | 9/2021 | Hsueh ............... H01L 21/76814 |
| 2022/0392800 A1* | 12/2022 | Lim ................. H01L 21/76814 |

* cited by examiner

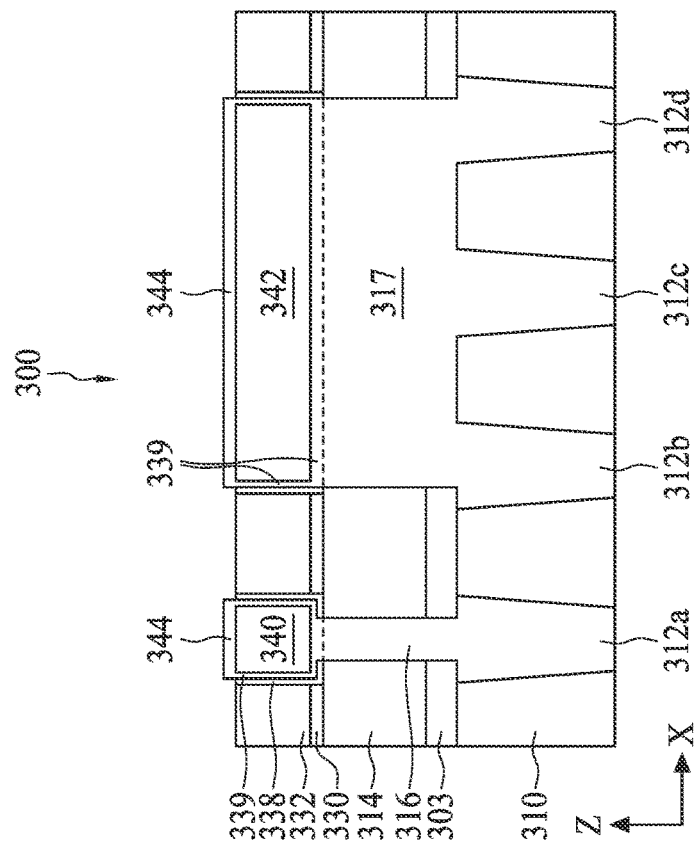
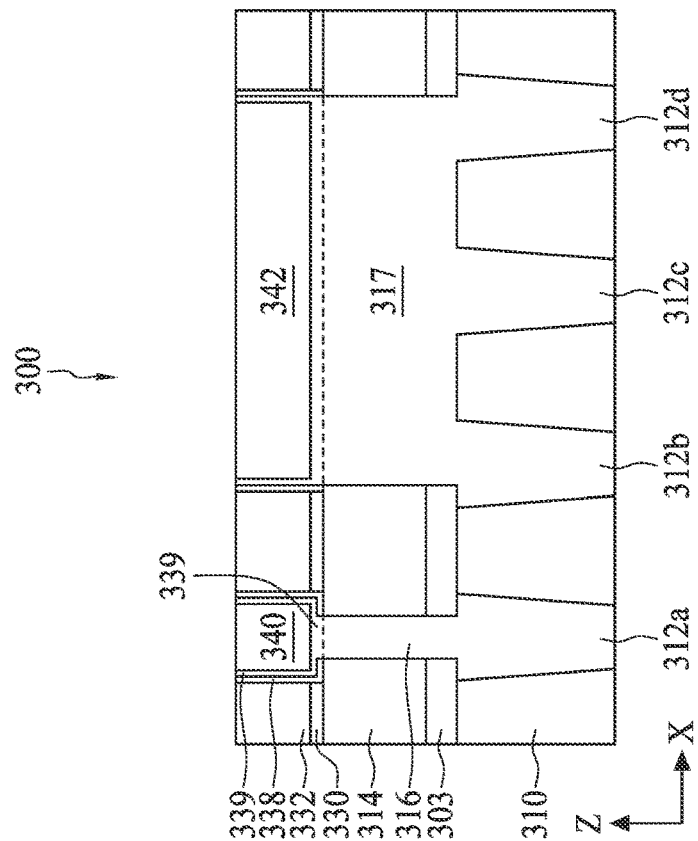

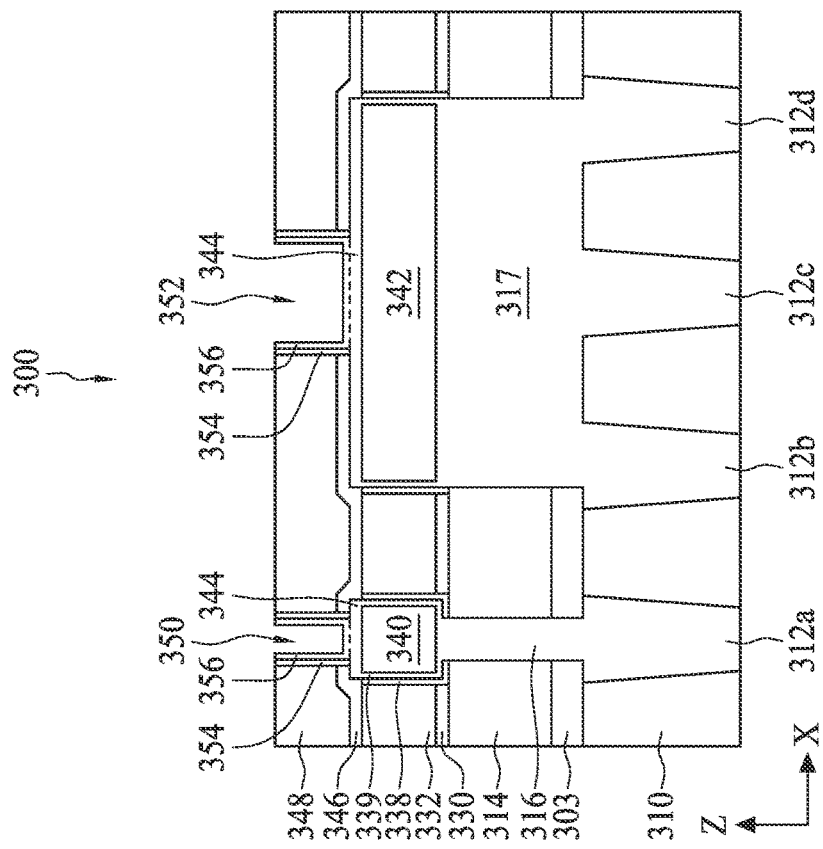
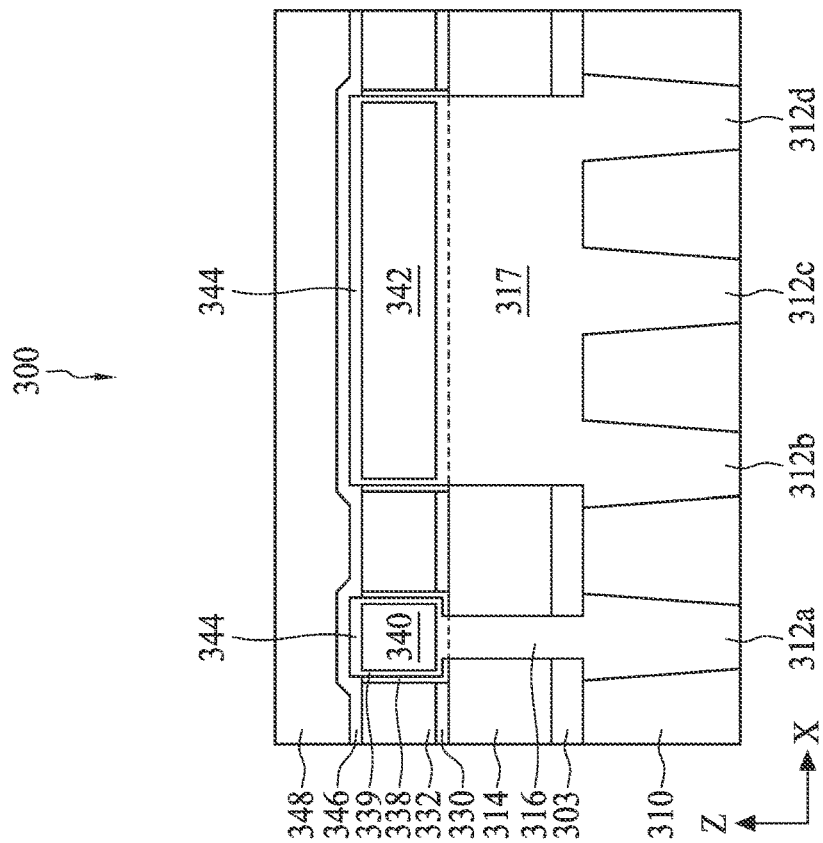

INTERCONNECT STRUCTURE AND METHODS OF FORMING THE SAME

CROSS-REFERENCE TO RELATED APPLICATIONS

This application claims priority to U.S. Provisional Application Ser. No. 63/453,083 filed on Mar. 18, 2023, which is incorporated by reference in its entirety.

BACKGROUND

Semiconductor devices are used in a variety of electronic applications, such as personal computers, cell phones, digital cameras, and other electronic equipment, as examples. Generally, a typical semiconductor device includes a substrate having active devices such as transistors and capacitors. These active devices are initially isolated from each other, and interconnect structures are subsequently formed over the active devices to create functional circuits. Such interconnect structures may include contact plugs, which may be electrically coupled to the active devices on the substrate. However, as dimensions of integrated circuits continue to scale to smaller sub-micron sizes in advanced node applications, it becomes an increasing challenge to reduce contact resistance while maintaining desired contact reliability. Therefore, improved structures and methods for manufacturing the same are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
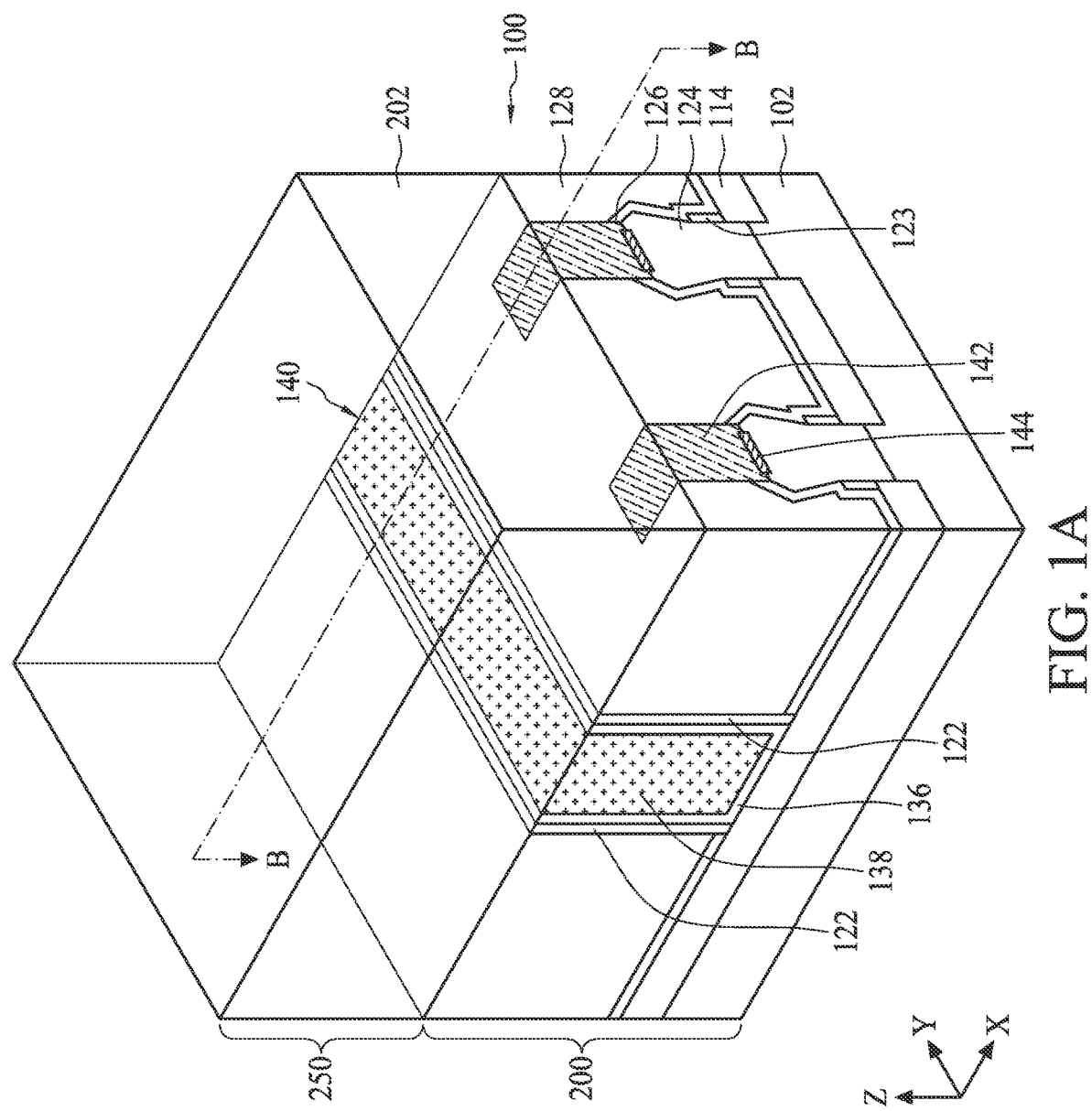
FIG. 1A is a perspective view of one of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
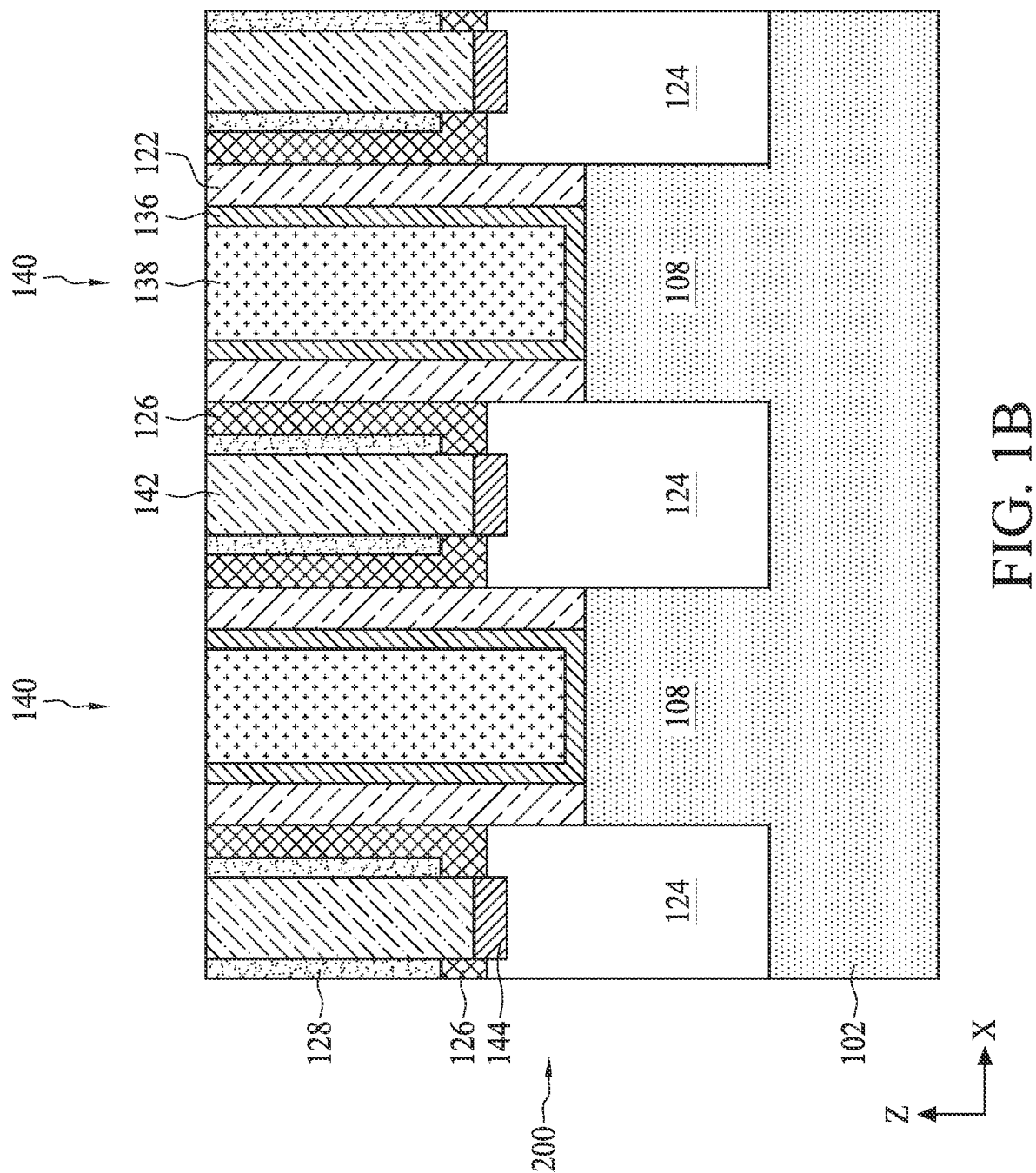
FIG. 1B is a cross-sectional side view of the stage of manufacturing the semiconductor device structure taken along line B-B of FIG. 1A, in accordance with some embodiments.

FIG. 1A illustrates a stage of manufacturing a semiconductor device structure 100 including a device layer 200 and an interconnect structure 250. FIG. 1B illustrates a cross-sectional view of the device layer 200 in accordance with some embodiments. The device layer 200 includes a substrate 102 and one or more devices formed in or on the substrate 102. The substrate 102 may be a semiconductor substrate. In some embodiments, the substrate 102 includes a single crystalline semiconductor layer on at least the surface of the substrate 102. The substrate 102 may include a crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). For example, the substrate 102 is made of Si. In some embodiments, the substrate 102 is a silicon-on-insulator (SOI) substrate, which includes an insulating layer (not shown) disposed between two silicon layers. In one aspect, the insulating layer is an oxygen-containing material, such as an oxide.

The substrate 102 may include various regions that have been suitably doped with impurities (e.g., p-type or n-type impurities). The dopants are, for example phosphorus for an n-type fin field effect transistor (FinFET) and boron for a p-type FinFET.

As described above, the device layer 200 may include any suitable devices, such as transistors, diodes, imaging sensors, resistors, capacitors, inductors, memory cells, or a combination thereof. In some embodiments, the device layer 200 includes transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode surrounding the channels. An example of the device formed on the substrate 102 is a FinFET, which is shown in FIGS. 1A and 1B. The device layer 200 includes source/drain (S/D) regions 124 and gate stacks 140 (only one is shown in FIG. 1A). Each gate stack 140 may be disposed between S/D regions 124 serving as source regions and S/D regions 124 serving as drain regions. For example, each gate stack 140 may extend along the Y-axis between one or more S/D regions 124 serving as source regions and one or more S/D regions 124 serving as drain regions. It should be understood that source/drain region(s) may refer to a source or a drain, individually or collectively dependent upon the context. As shown in FIG. 1B, two gate stacks 140 are formed on the substrate 102. In some embodiments, more than two gate stacks 140 are formed on the substrate 102. While not shown, channel regions are formed between the S/D regions 124 and have at least three surfaces wrapped around by the gate stack 140.

The S/D regions 124 may include a semiconductor material, such as Si or Ge, a III-V compound semiconductor, a II-VI compound semiconductor, or other suitable semiconductor material. Exemplary S/D region 124 may include, but are not limited to, Ge, SiGe, GaAs, AlGaAs, GaAsP, SiP, InAs, AlAs, InP, GaN, InGaAs, InAlAs, GaSb, AlP, GaP, and the like. The S/D regions 124 may include p-type dopants, such as boron; n-type dopants, such as phosphorus or arsenic; and/or other suitable dopants including combinations thereof. The S/D regions 124 may be formed by an epitaxial growth method using CVD, atomic layer deposition (ALD) or molecular beam epitaxy (MBE). The channel regions may include one or more semiconductor materials, such as Si, Ge, GeSn, SiGe, GaAs, InSb, GaP, GaSb, InAlAs, InGaAs, GaSbP, GaAsSb, GaN, GaP, or InP. The channel regions may include the same semiconductor material as the substrate 102. In some embodiments, the device layer 200 may include FinFETs, and the channel regions are a plurality of fins disposed below the gate stacks 140. In some embodiments, the device layer 200 may include nanostructure transistors, and the channel regions are surrounded by the gate stacks 140.

As shown in FIGS. 1A and 1B, each gate stack 140 includes a gate electrode layer 138 disposed over the channel region (or surrounding the channel region for nanostructure transistors). The gate electrode layer 138 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. The gate stack 140 may further include a gate dielectric layer 136 disposed over the channel region. The gate electrode layer 138 may be disposed over the gate dielectric layer 136. In some embodiments, an interfacial layer (not shown) may be disposed between the channel region 108 and the gate dielectric layer 136, and one or more work function layers (not shown) may be formed between the gate dielectric layer 136 and the gate electrode layer 138. The interfacial dielectric layer may include a dielectric material, such as an oxygen-containing material or a nitrogen-containing material, or multilayers thereof, and may be formed by any suitable deposition method, such as CVD, PECVD, or ALD. The gate dielectric layer 136 may include a dielectric material such as an oxygen-containing material or a nitrogen-containing material, a high-k dielectric material having a k value greater than that of silicon dioxide, or multilayers thereof. The gate dielectric layer 136 may be formed by any suitable method, such as CVD, PECVD, or ALD. In some embodiments, the gate dielectric layer 136 may be a conformal layer. The term "conformal" may be used herein for case of description upon a layer having substantial same thickness over various regions. The one or more work function layers may include aluminum titanium carbide, aluminum titanium oxide, aluminum titanium nitride, or the like.

Gate spacers 122 are formed along sidewalls of the gate stacks 140 (e.g., sidewalls of the gate dielectric layer 136). The gate spacers 122 may include silicon oxycarbide, silicon nitride, silicon oxynitride, silicon carbon nitride, the like, multi-layers thereof, or a combination thereof, and may be deposited by CVD, ALD, or other suitable deposition technique. In some embodiments, fin sidewall spacers 123 may be disposed on opposite sides of each S/D region 124, and the fin sidewall spacers 123 may include the same material as the gate spacers 122. Portions of the gate stacks 140, the gate spacers 122, and the fin sidewall spacers 123 may be disposed on isolation regions 114. The isolation regions 114 are disposed on the substrate 102. The isolation regions 114 may include an insulating material such as an oxygen-containing material, a nitrogen-containing material, or a combination thereof. In some embodiments, the isolation regions 114 are shallow trench isolation (STI). The insulating material may be formed by a high-density plasma chemical vapor deposition (HDP-CVD), a flowable chemical vapor deposition (FCVD), or other suitable deposition process. In one aspect, the isolation regions 114 includes silicon oxide that is formed by a FCVD process.

A contact etch stop layer (CESL) 126 is formed on the S/D regions 124 and the isolation region 114, and an interlayer dielectric (ILD) layer 128 is formed on the CESL 126. The CESL 126 can provide a mechanism to stop an etch process when forming openings in the ILD layer 128. The CESL 126 may be conformally deposited on surfaces of the S/D regions 124 and the isolation regions 114. The CESL 126 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, ALD, or any suitable deposition technique. The ILD layer 128 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than that of silicon dioxide), and may be deposited by spin-on, CVD, FCVD, PECVD, PVD, or any suitable deposition technique.

S/D contacts 142 may be disposed in the ILD layer 128 and over the S/D region 124. The S/D contacts 142 may be electrically conductive and include a material having one or more of Ru, Mo, Co, Ni, W, Ti, Ta, Cu, Al, TiN or TaN, and the conductive contact may be formed by any suitable method, such as electro-chemical plating (ECP), or PVD. A silicide layer 144 may be disposed between the S/D contacts 142 and the S/D region 124. The silicide layers 144 may be made of a metal or metal alloy silicide, and the metal includes a noble metal, a refractory metal, a rare earth metal, alloys thereof, or combinations thereof.

In integrated circuits, interconnection structures (or interconnect structures) are used to provide signal routing and power supply to semiconductor devices. An integrated circuit chip typically includes a device layer, fabricated during front-end-of-line (FEOL) and middle-end-of-line (MEOL) processes, and a back-end-of-line (BEOL) layer. The device layer may be formed in and/or on the substrate, and the BEOL layer is formed on a front side and/or backside of the device layer. The device layer may include various semiconductor devices, such as transistors, diodes, capacitors, resistors, etc., and may be formed in and/or on the substrate. In some embodiments, the device layer may also include the MEOL structures, such as one or more dielectric layers with conductive features connected to gates and source/drain features in the device layer. Interconnection structures typically include conductive lines and vias formed in both the device layer and the BEOL layers.

Figure 2:
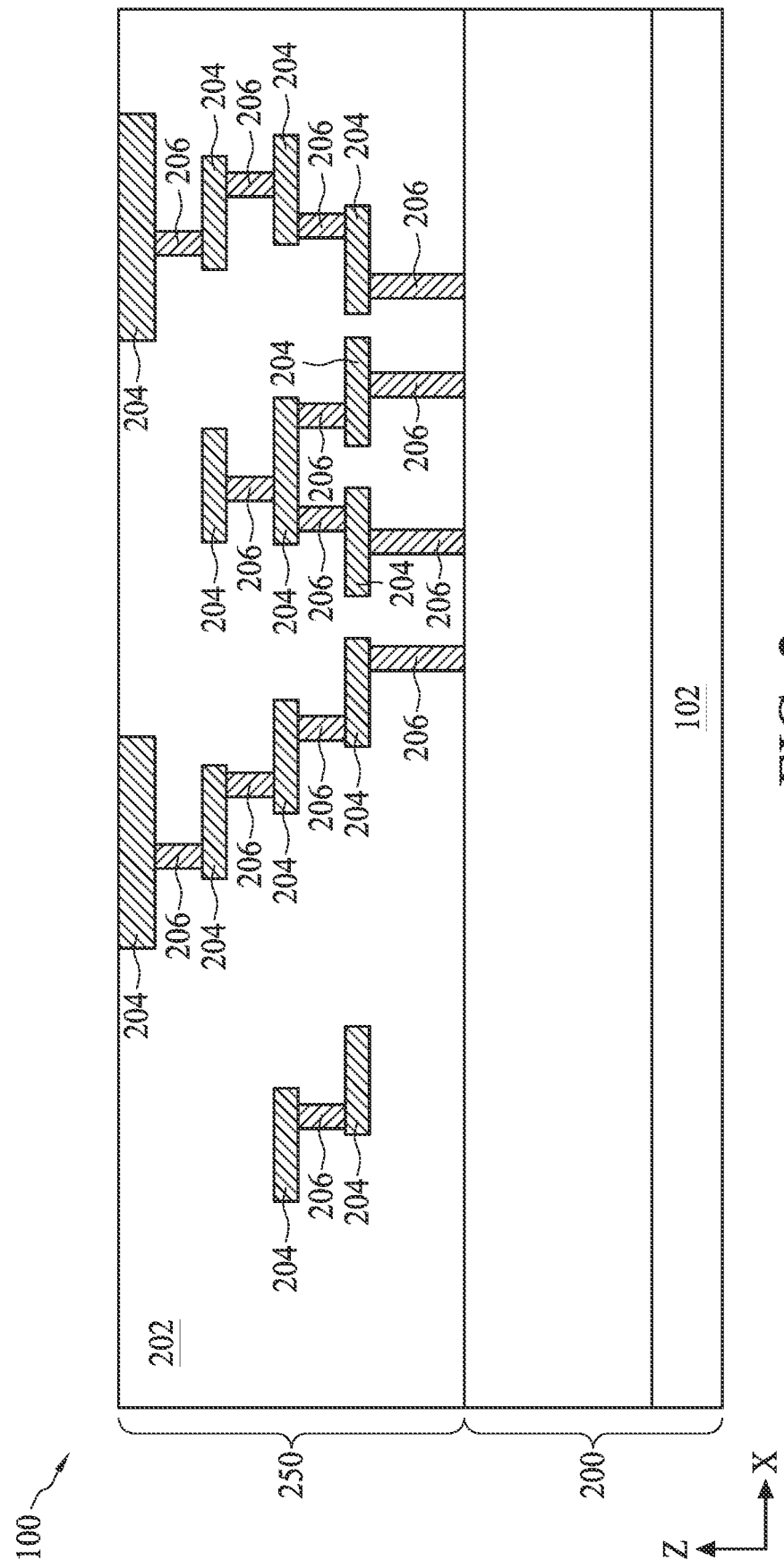
FIG. 2 is a cross-sectional side view of a stage of manufacturing the semiconductor device structure, in accordance with some embodiments.

FIG. 2 is a cross-sectional side view of a stage of manufacturing the semiconductor device structure 100, in accordance with some embodiments. The interconnect structure 250 is disposed over the device layer 200 and the substrate 102. The interconnect structure 250 includes various conductive features, such as a first plurality of conductive features 204 and second plurality of conductive features 206, and an intermetal dielectric (IMD) layer 202 to separate and isolate various conductive features 204, 206. In some embodiments, the first plurality of conductive features 204 are conductive lines and the second plurality of conductive features 206 are conductive vias. The interconnect structure 250 includes multiple levels of the conductive features 204, and the conductive features 204 are arranged in each level to provide electrical paths to the device layer 200 disposed below. The conductive features 206 provide vertical electrical routing from the device layer 200 to the conductive features 204 and between conductive features 204. For example, the bottom-most conductive features 206 of the interconnect structure 250 may be electrically connected to the conductive contacts disposed over the S/D regions 124 (FIGS. 1A and 1B) and the gate electrode layer 138 (FIGS. 1A and 1B). The conductive features 204 and conductive features 206 may be made from one or more electrically conductive materials, such as metal, metal alloy, metal nitride, or silicide. For example, the conductive features 204 and the conductive features 206 are made from copper, aluminum, aluminum copper alloy, titanium, titanium nitride, tantalum, tantalum nitride, titanium silicon nitride, zirconium, gold, silver, cobalt, nickel, tungsten, tungsten nitride, tungsten silicon nitride, platinum, chromium, molybdenum, hafnium, other suitable conductive material, or a combination thereof. In some embodiments, a backside interconnection structure (not shown), similar to the interconnect structure 250, may be formed on the backside of the device layer 200 to provide power supply and/or additional signal connection to the device layer 200.

The IMD layer 202 includes one or more dielectric materials to provide isolation functions to various conductive features 204, 206. The IMD layer 202 may include multiple dielectric layers embedding multiple levels of conductive features 204, 206. The IMD layer 202 is made from a dielectric material, such as $SiO_x$, $SiO_xC_yH_2$, or $SiO_xC_y$, where x, y and z are integers or non-integers. In some embodiments, the IMD layer 202 includes a dielectric material having a k value ranging from about 1 to about 5.

Figure 3B:
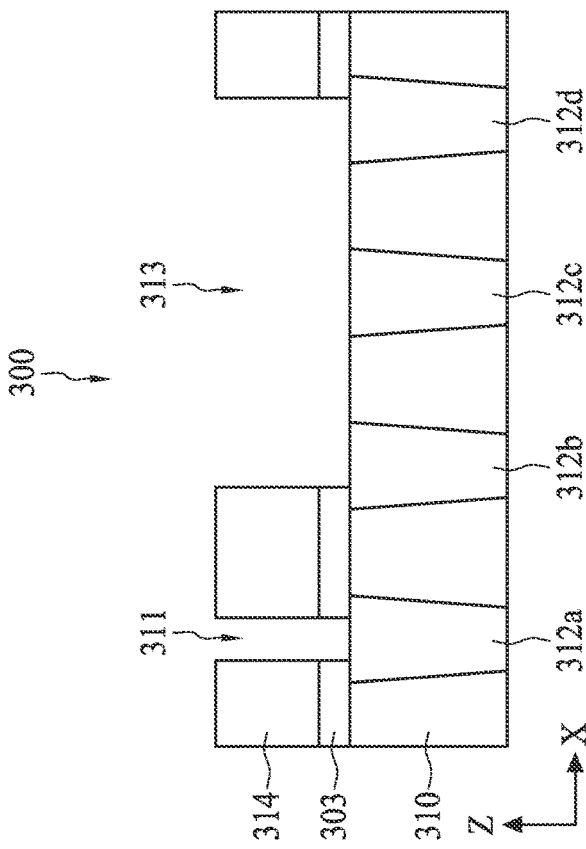
FIGS. 3A-3P are cross-sectional side views of various stages of manufacturing an interconnect structure, in accordance with some embodiments.
Figure 3A:
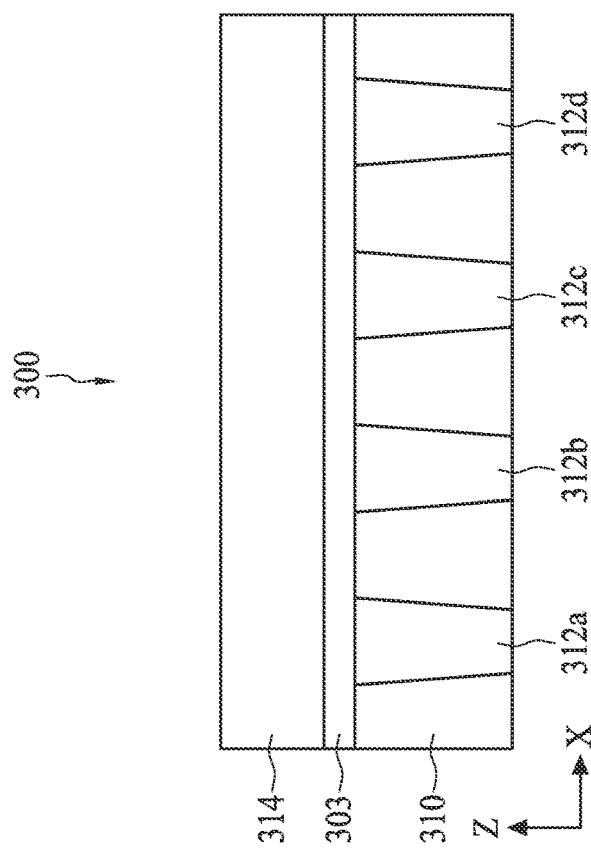
Figure 3D:
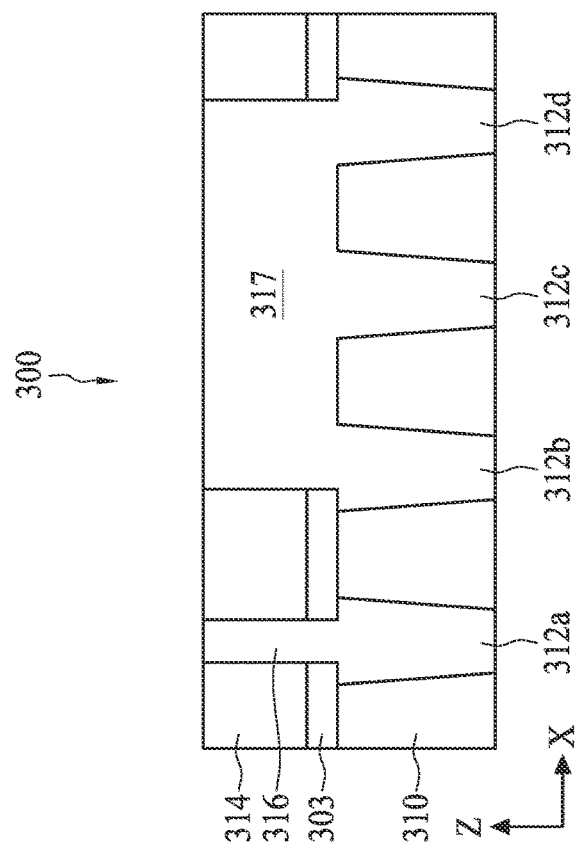
Figure 3C:
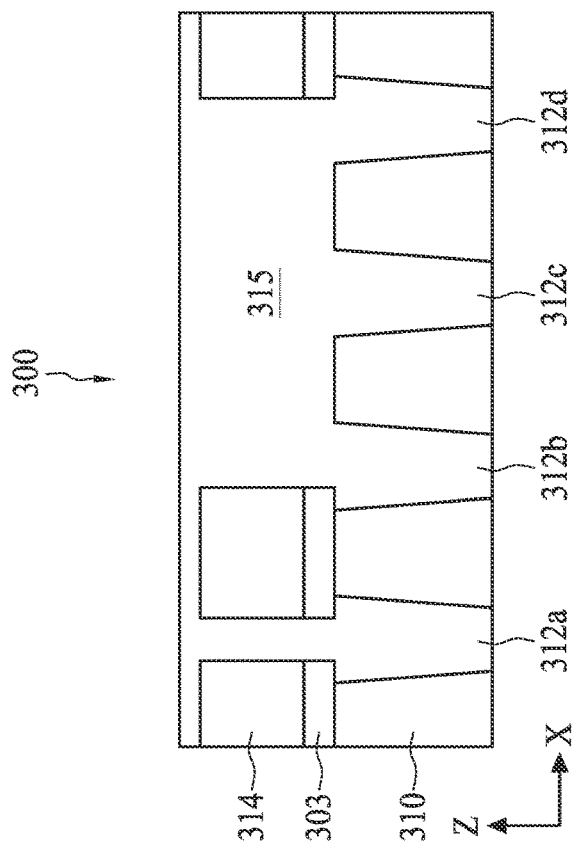
Figure 3E:
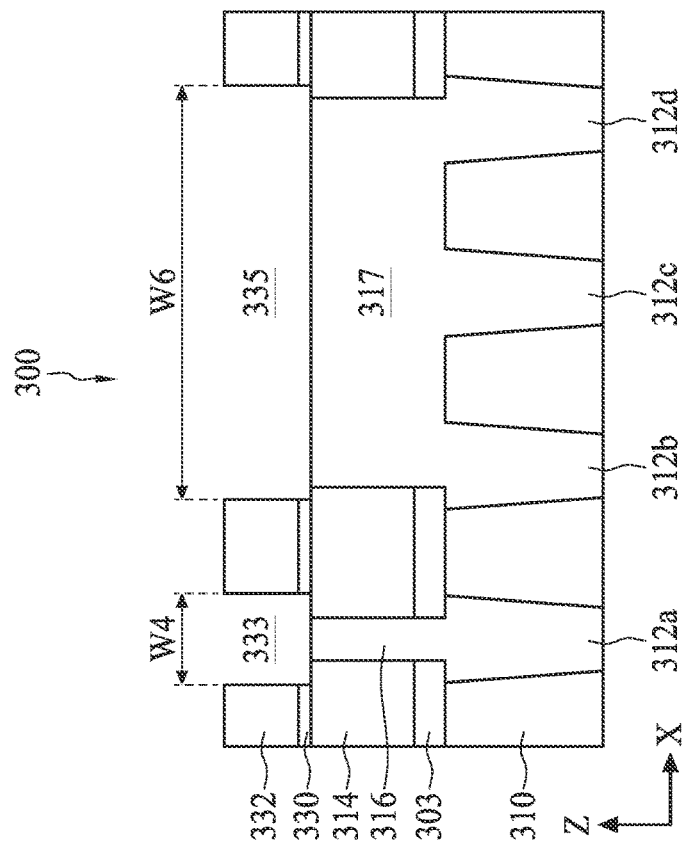
Figure 3F:
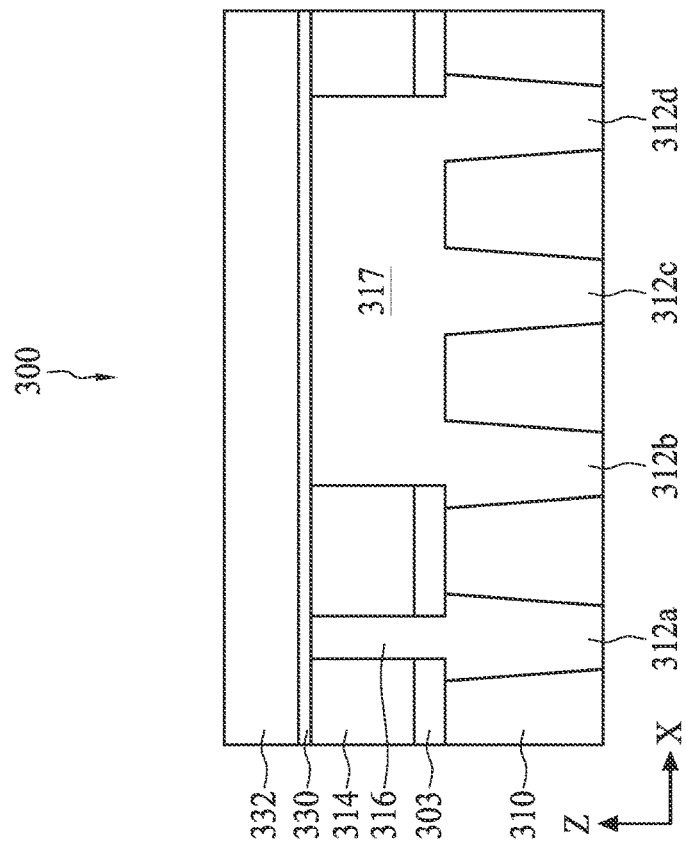
Figure 3G:
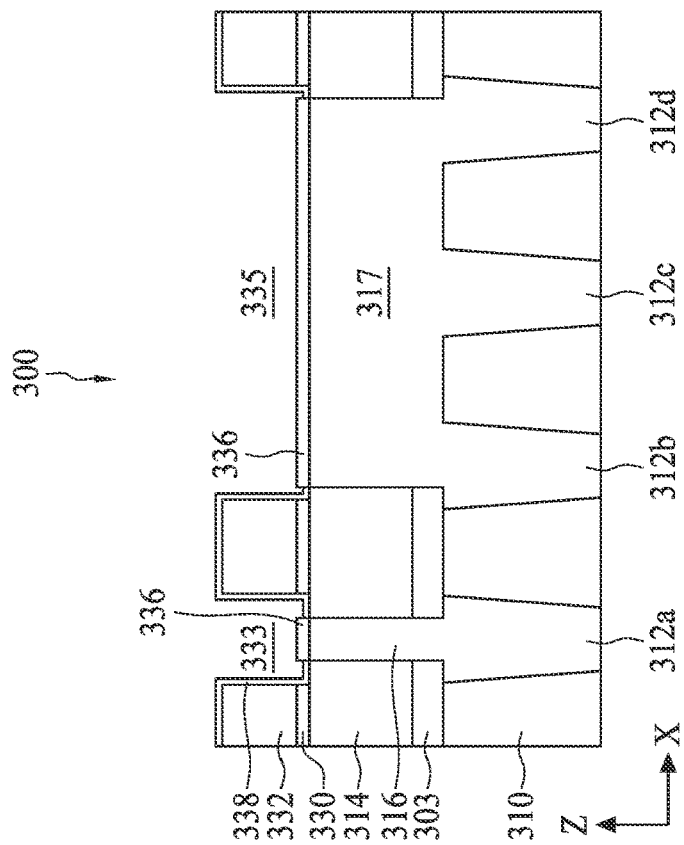
Figure 3H:
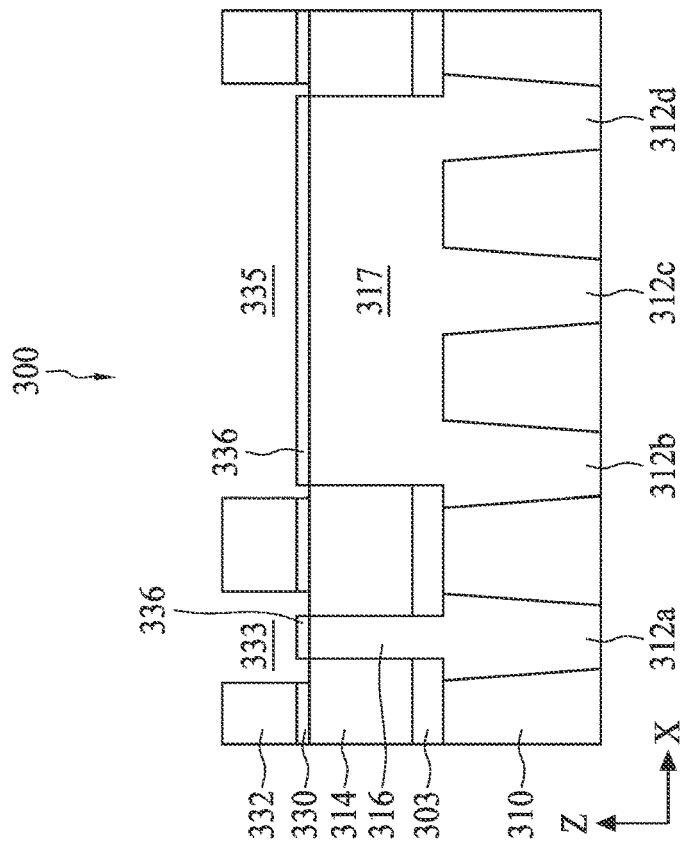
Figure 3J:
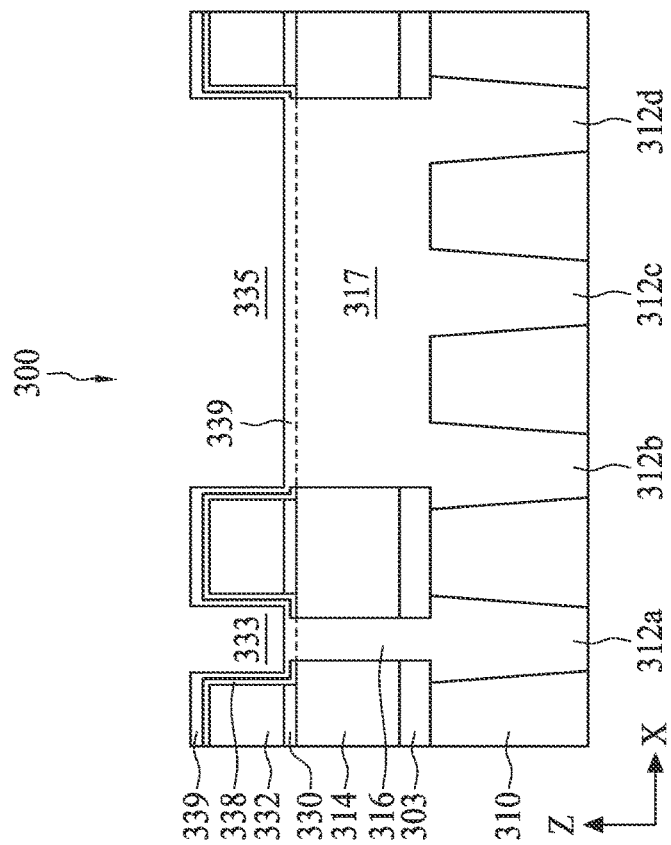
Figure 3I:
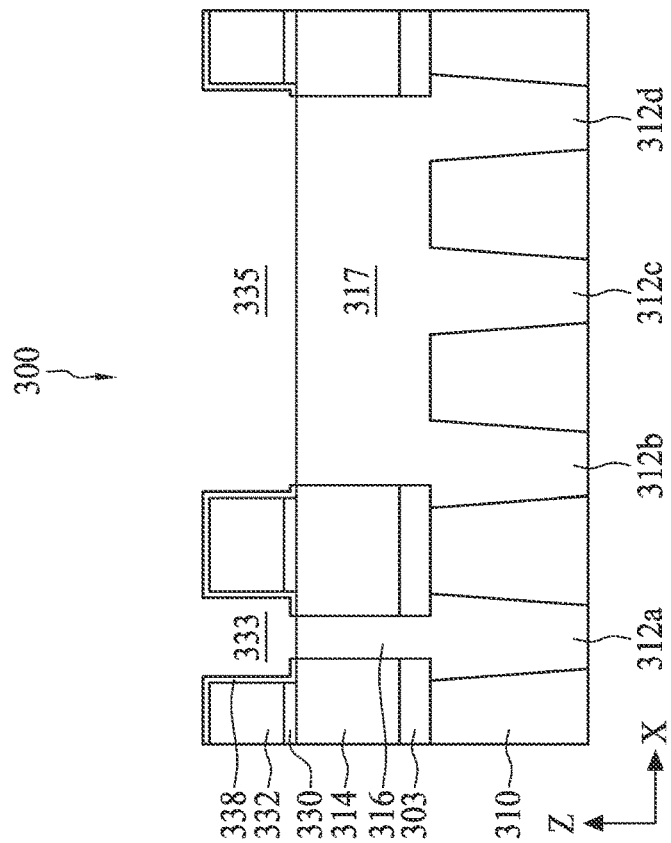
Figures 1, 3L:
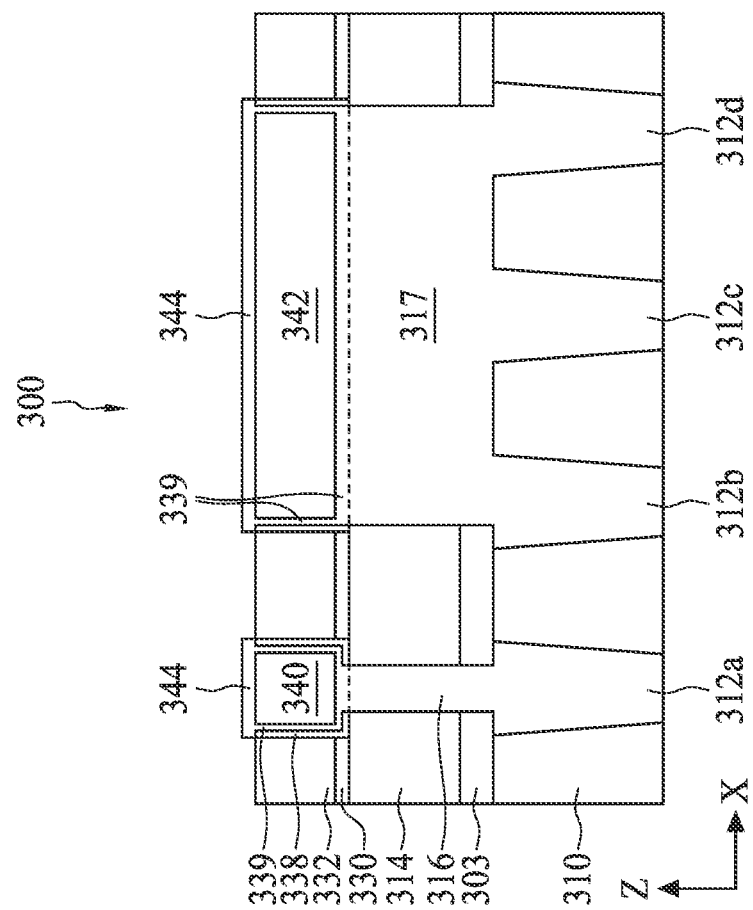
Figure 3P:
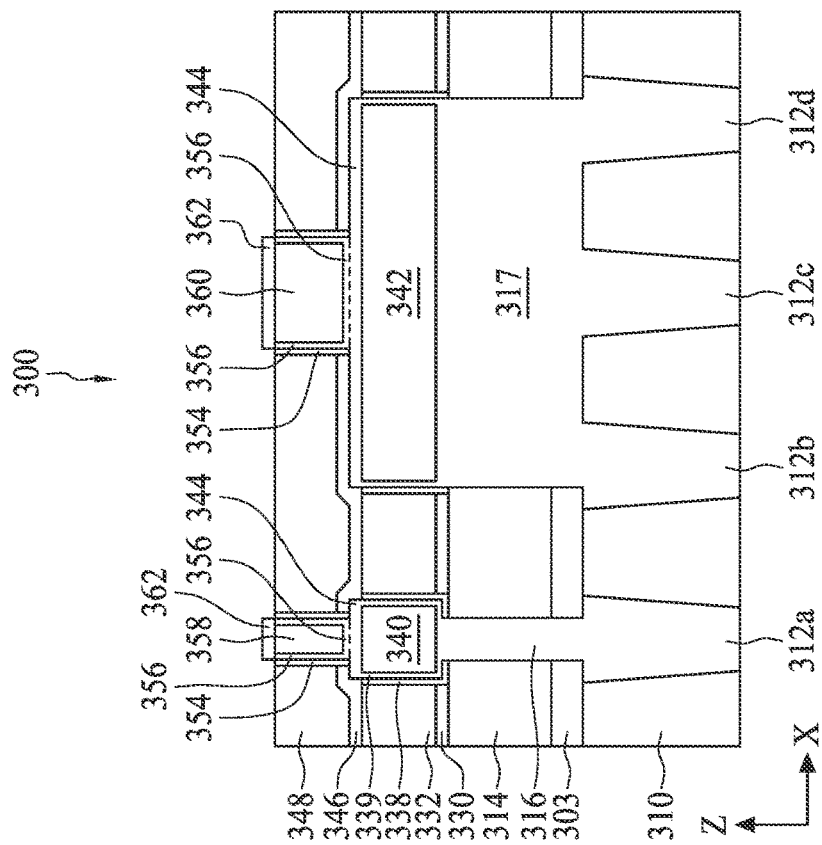

FIGS. 3A-3P are cross-sectional side views of various stages of manufacturing an interconnect structure 300, in accordance with some embodiments. The interconnect structure 300 may be used to form one or more layers of the interconnect structure 250 shown in FIGS. 1A and 1B as well as FIG. 2. As shown in FIG. 3A, the interconnect structure 300 includes a dielectric layer 310 (e.g., a zero-level interlayer dielectric, ILD0) and a dielectric layer 314 (e.g., a first interlayer dielectric, ILD1) disposed over the dielectric layer 310. The dielectric layer 310 includes one or more conductive features 312a-312d (collectively referred to as 312) disposed in the dielectric layer 310. An etch stop layer 303 may be optionally disposed between the dielectric layer 310 and the dielectric layer 314. The dielectric layer 310, 314 may be an ILD layer or an IMD layer. For example, the dielectric layer 310, 314 may be the ILD layer 128 (FIGS. 1A and 1B) or the IMD layer 202 (FIG. 2). The dielectric layer 310, 314 may include the same material as the ILD layer 128 or the IMD layer 202. In one exemplary embodiment, the dielectric layer 310 is an ILD layer and the dielectric layer 314 is an IMD layer.

The etch stop layer 303, if used, is formed on the dielectric layer 310 and the one or more conductive features 312. The etch stop layer 303 may be a single layer or a multi-layer structure. In some embodiments, the etch stop layer 303 includes a silicon-containing material, such as SiN, SiCO, SiCN, SiCON, $SiO_x$, SiC, SiON, or other suitable material. The etch stop layer 303 may include a material different from the dielectric layer 310 to have different etch selectivity compared to the dielectric layer 310. The etch stop layer 303 may be formed by any suitable process, such as CVD. ALD, spin-on, or any conformal deposition process. The etch stop layer 303 may have a thickness ranging from about 1 Angstrom to about 100 Angstroms.

The dielectric layer 310, 314 may be a low-k dielectric material. For example, the dielectric layer 310, 314 may be an oxide formed by TEOS, un-doped silicate glass, or doped silicon oxide such as BPSG, fused FSG, PSG, BSG, OSG, SiOC, SiOCH, and/or any suitable low-k dielectric material. The dielectric layer 310, 314 may be deposited by spin-on coating, CVD, FCVD, PECVD, PVD, or any suitable deposition technique. The thickness of the dielectric layer 310, 314 may be in a range between 175 Angstroms to about 4500 Angstroms.

The conductive features 312 includes an electrically conductive material, such as Cu, Co, Ru, Mo, Cr, W, Mn, Rh, Ir, Ni, Pd, Pt, Ag, Au, Al, alloys thereof, or other suitable material. In some embodiments, the conductive features 312 are a metal containing carbon. In such cases, the atomic percentage at. % of the carbon in the conductive features 312 may be about 1 at. % or less. For example, the conductive features 312 may be Ru having carbon of about 1 at. % or less. The conductive features 312 may be formed by PVD, CVD. ALD, or other suitable process. In one embodiment, the conductive features 312 are deposited by a CVD process. The one or more conductive features 312 may be used to electrically connect the S/D regions 124 (FIGS. 1A and 1B) to the gate electrode layer 138 (FIGS. 1A and 1B). In some embodiments, the conductive features 312 may be the conductive contact (e.g., S/D contacts) disposed in the ILD layer 128, or the conductive feature 204, 206 disposed in the IMD layer 202, such as the conductive lines or conductive vias as shown in FIG. 2. In one exemplary embodiment, the conductive features 312 are the S/D contacts, such as the S/D contacts 142 shown in FIGS. 1A and 1B. The conductive features 312 are in direct contact with the dielectric layer 310 (i.e., no barrier is disposed between the conductive features 312 and the dielectric layer 310). In some embodiments, the conductive feature 312 may include a barrier layer (not shown) disposed between the dielectric layer 310 and the electrically conductive material of the conductive feature 312. The barrier layer may include an electrically conductive material, such as a metal or metal nitride.

In FIG. 3B, openings 311, 313 are formed through the dielectric layer 314 and the etch stop layer 303 to expose a top surface of the conductive features 312. The openings 311, 313 are intended to be filled with an electrically conductive material to form conductive features (e.g., conductive features 204 or 206) therein. The openings 311, 313 may be via openings or line openings and may be formed as a result of one or more etch processes. In some embodiments, both openings 311, 313 are via openings. In some embodiments, both openings 311, 313 are line openings. In some embodiments, the opening 311 is a via opening and the opening 313 is a line opening. The opening 311 has a first width and the opening 313 has a second width greater than the first width. The first width and the second width may be at a ratio of about 1:4 to about 1:8. In some embodiments, the opening 311 is directly above and substantially aligned with the one conductive feature (e.g., conductive feature 312a), and the opening 313 is formed to expose a plurality of conductive features 312 (e.g., conductive feature 312b-312d).

In FIG. 3C, the openings 311, 313 are filled with an electrically conductive material 315. The electrically conductive material 315 may include, but is not limited to, Cu, Co, Al, Ru, Mo, W, Ni, Ti, Zr, Ta, Zn, alloys thereof, or other suitable material. In one exemplary embodiment, the openings 311, 313 are filled with the same material as the conductive features 312, such as Ru. In some embodiments, the conductive material 315 is a metal containing carbon. In such cases, the atomic percentage at. % of the carbon in the conductive material 315 may be about 1 at. % or less. For example, the conductive material 315 may be Ru having carbon of about 1 at. % or less. The conductive material 315 may be deposited using any suitable process, such as ECP, electroless deposition (ELD), PVD, or CVD. The conductive material 315 may overfill the openings 311, 313 until a height of the conductive material is deposited on the dielectric layer 314. The conductive material 315 is deposited in the openings 311, 313 without any barrier layer or liner formed between the conductive material 315 and the dielectric layer 314 (or the etch stop layer 303).

In FIG. 3D, a planarization process, such as a CMP process, is performed on the conductive material 315 until the dielectric layer 314 is exposed. In some embodiments, a portion of the dielectric layer 314 may be removed. After the planarization process, conductive features 316, 317 are formed in the dielectric layer 314, and the top surfaces of the conductive features 316, 317 and the dielectric layer 314 are substantially co-planar. The conductive features 316, 317 may be the conductive feature 206 (FIG. 2). For example, the conductive features 316, 317 may be conductive vias for the source/drain contacts (e.g., conductive features 312). In one exemplary embodiment, the conductive features 316, 317 are in direct contact with the dielectric layer 314 and the etch stop layer 303 (if used).

In cases where the conductive features 316, 317 include a metal that is susceptible to diffusion (e.g., Cu), a barrier layer may be formed between the dielectric layer 314 and the conductive features 316, 317 to prevent metal diffusion from the conductive features 316, 317 to the dielectric layer 314. In some embodiments, a liner may be further formed between the barrier layer and the conductive features 316, 317. The liner may function as a glue layer so that both the conductive features 316, 317 and the barrier layer are adhered to the liner. The barrier layer and the liner may be formed by any suitable process, such as CVD, PECVD, or ALD. In some embodiments, the barrier layer and the liner are conformal layers formed by ALD. If used, the barrier layer may include Ta, Ti, Mn, Zn, In, TaN, TiN, or other suitable material. The liner may include a metal, such as Co. Alternatively, the liner may include the same material as the conductive features 316, 317. In some embodiments, the conductive features 316, 317 include a metal that is not susceptible to diffusion, such as Ru or Co, and the barrier layer and the liner may be omitted.

In FIG. 3E, a first etch stop layer 330 and a first dielectric layer 332 for back-end-of-line (BEOL) interconnection structure are formed on the dielectric layer 314. The first dielectric layer 332 may be the dielectric layer 202 (FIG. 2). The first dielectric layer 332 may include the same material as the dielectric layer 310, 314, and may be formed by the same process as the dielectric layer 310, 314. The first etch stop layer 330 may include a material different from the first dielectric layer 332 in order to have different etch selectivity compared to the first dielectric layer 332. In some embodiments, the first etch stop layer 330 is made of a dielectric material, such as an oxide, a nitride, a metal oxide, a metal nitride, or a combination thereof. Suitable materials for the first etch stop layer 330 may include, but not limited to, silicon nitride, silicon carbide, oxygen-doped silicon carbide (ODC), silicon carbon nitride, silicon oxynitride, carbon nitride, silicon oxide, silicon carbon oxide, and aluminum oxide, etc. The first etch stop layer 330 may be a single layer or a multi-layer structure. In some embodiments, the first etch stop layer 330 includes a carbide and a nitride. In some embodiments, the first etch stop layer 330 includes an oxide and a nitride. In some embodiments, the first etch stop layer 330 may include two or more layers of dielectric material discussed herein. If the first etch stop layer 330 is a multi-layer structure, each layer may include the same dielectric material but with different ratio, composition, and/or oxidation rates. The first etch stop layer 330 may be formed by any suitable process, such as CVD, ALD, PVD, PEALD, or PECVD.

In FIG. 3F, openings 333, 335 are formed in and through the first dielectric layer 332 and the first etch stop layer 330 to expose a portion of the conductive features 316, 317, respectively. The opening 333 is disposed over at least one of the conductive features 316. The openings 333, 335 may be via or line openings and are intended to be filled with a conductive material to form conductive features therein. The openings 333, 335 may be formed by any suitable process, such as one or more etch processes. The etch processes remove a portion of the first dielectric layer 332 and the first etch stop layer 330 so that the opening 333 exposes a portion of a top surface of the corresponding conductive feature 316. Likewise, the etch processes remove a portion of the first dielectric layer 332 and the first etch stop layer 330 so that the opening 333 exposes a portion of a top surface of the corresponding conductive feature 317. In some embodiments, the openings 333 are via openings and the openings 335 are line openings. The openings 333, 335 generally have a diameter larger than the diameter of the conductive features 316, 317, respectively. In some embodiments, the opening 333 may have a dimension W4 and the opening 335 may have a dimension 335 greater than the dimension W3. In some embodiments, the dimension W4 and the dimension W6 may have a ratio (W4:W6) in a range of about 1:3 to 1:35.

In FIG. 3G, a blocking layer 336 is selectively formed on the exposed top surface of the conductive features 316, 317. The blocking layer 336 is used to prevent the subsequent first barrier layer 338 from forming on the exposed top surface of the conductive features 316, 317. In some embodiments, the blocking layer 336 may be formed by exposing the top surface of the conductive features 316, 317 to a blocking agent through the use of CVD, ALD, wet coating, immersion process, or other suitable methods. The blocking agent may include one or more inhibitors configured to selectively attach to the metallic surface of the conductive features 316, 317. Suitable inhibitors may include, but are not limited to, bezotriazole ($C_6H_5N_3$), benzimidazole ($C_7H_6N_2$), tolyltriazole ($C_7H_7N_3$), oxalic acid ($C_2H_2O_4$), malonic acid ($C_3H_4O_4$), citric acid ($C_6H_8O_7$), lactic acid ($C_3H_6O_3$), ethylenediaminetetraacetic acid ($C_{10}H_{16}N_2O_8$), tetraacetic acid ($C_{14}H_{24}N_2O_{10}$), pentetic acid ($C_{14}H_{23}N_3O_{10}$), and nitrilotriacetic acid ($C_6H_9NO_6$), or the like. In other embodiments, the blocking agent may include inorganic inhibitors, such as chromates, nitrites, molybdates and phosphates, and the cathodic type inhibitors, such as zinc and polyphosphate inhibitors.

In some embodiments, the blocking layer 336 may be organic material including small molecule or polymer. The blocking layer 336 may include one or more self-assembled monolayers (SAMs) having a head group and a tail group. The head group of the SAM may be selected depending on the material of the conductive features 316, 317. For example, the head group of the SAM may include a compound terminated with an alkyne group when Ru is used as the conductive features 316, 317, or an azole group-containing compound when Cu or Co is used as the conductive features 316, 317. In some embodiments, the head group of the SAM may include a phosphorus (P), sulfur (S), silicon (Si), or nitrogen (N) terminated compound which may only attach to the metallic surfaces of the conductive features 316, 317. The head group of the SAM may not form on the dielectric surface of the first dielectric layer 332 and the first etch stop layers 330. The tail group of the SAM may include a highly hydrophobic long alkyl chain which blocks adsorption of a precursor (e.g., precursor for forming the subsequent first barrier layer 338) from forming on the blocking layer 336. In some embodiments, the tail group includes a polymer such as polyimide. The blocking layer 336 may be formed by supplying a blocking agent to the exposed surfaces, for example by CVD, ALD, molecular layer deposition (MLD), wet coating, immersion process, or other suitable methods.

In some embodiments, the blocking layer 336 is formed by a wet-coating process, and the solution for wet coating may be a protic organic solvent such as alcohols, carboxylic acids, or a combination thereof. Exemplary protic organic solvents may include, but are not limited to, methanol, ethanol, 1-propanol, 2-propanol, 1-butanol, 1-pentanol, 1-hexanol, 1-heptanol, 2-ethoxyethanol, and mixtures thereof. The solution for wet coating may also be a polar or nonpolar protic solvent. Exemplary polar aprotic solvents may include, but are not limited to, N,N-dimethylformamide, N-methyl-2-pyrrolidinone, acetonitrile, acetone, ethyl acetate, benzyl ether, trioctylphosphine, trioctylphosphine oxide, and mixtures thereof. Exemplary nonpolar protic solvents may include, but are not limited to, alkane, olefin, an aromatic, an ester or an ether solvent, hexane, octane, benzene, toluene, xylene, and mixtures thereof.

In FIG. 3H, a first barrier layer 338 is selectively deposited on the first dielectric layer 332, the first etch stop layer 330, and the dielectric layer 314. The first barrier layer 338 serves to prevent the metal diffusion from the subsequent conductive features 340, 342 to the dielectric layer 314 and the first dielectric layer 332. The first barrier layer 338 may include metal nitride, metal oxide, two-dimensional (2D) material, or a combination thereof. Suitable metals for the first barrier layer 338 may include, but are not limited to, Ta, Ti, W, Mn, Zn, In, or Hf. In some embodiments, the first barrier layer 338 is a metal nitride, such as TaN, TiN or WN, or a metal oxide, such as HfO. In one exemplary embodiment, the first barrier layer 338 is TaN. The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), or transition metal dichalcogenides ($MX_2$), where M is a transition metal element and X is a chalcogenide element. Some exemplary $MX_2$ materials may include, but are not limited to Hf, $Te_2$, $WS_2$, $MoS_2$, $WSe_2$, $MoSe_2$, or any combination thereof.

With the blocking layer 336 formed on the metallic surfaces of the conductive features 316, 317, the first barrier layer 338 is selectively formed on the exposed dielectric surfaces of the first dielectric layer 332, the first etch stop layer 330, and the dielectric layer 314, and not formed on the blocking layer 336. The blocking layer 336 may block the first barrier layer 338 from forming on the metallic surface of the conductive features 316, 317. Specifically, the blocking layer 336 blocks the precursor(s) of the first barrier layer 338 from forming thereon, so the precursor(s) of the first barrier layer 338 grows on the dielectric surfaces, such as the surfaces of the first dielectric layer 332, the first etch stop layer 330, and the dielectric layer 314. The selective deposition of the first barrier layer 338 can also be achieved and/or enhanced through the use of ALD process and/or MLD process so that the first barrier layer 338 has the characteristic or property of being specific in bonding with the first dielectric layer 332, the first etch stop layer 330, and the dielectric layer 314 through self-limiting surface reactions.

In FIG. 3I, the blocking layer 336 is removed to expose the top surface of the conductive features 316, 317. The blocking layer 336 may be removed using thermal degradation or plasma bombardment, or other suitable process. The removal process does not substantially affect the first barrier layer 338 and the conductive feature 316, 337.

In FIG. 3J, a first liner 339 is deposited on the first barrier layer 338. The first liner 339 serves as a glue layer to allow better adhesion of the subsequent conductive features 340, 342 to the first barrier layer 338. As will be discussed in more detail in FIG. 5, a portion of the first liner 339 in contact with a bottom surface of the subsequent conductive features 340, 342 may have a thicker thickness to help prevent the conductive features 340, 342 from diffusing into the conductive features 316, 317. The first liner 339 may include the same material as the conductive features 316, 317, and may be formed by a conformal process, such as ALD. Suitable material for the first liner 339 may include, but is not limited to, Ru, Co, Mn, Zn, Zr, W, Mo, Os, Ir, Al, Fe, Ni, alloys thereof, or combinations thereof. In some embodiments, the first liner 339 is Ru or Co. In some embodiments, the first liner 339 is a Co-free layer. In one exemplary embodiment, the first liner 339 is pure ruthenium (Ru). The term "pure Ru" described in this disclosure refers to ruthenium having a concentration of about 99 at. % or above. The use of ruthenium may be advantageous when copper (Cu) is used for the subsequent conductive features 340, 342 as it helps maintain proper adhesion with Cu without restricting Cu reflow during the deposition process of the conductive features 340, 342. The first barrier layer 338 and the first liner 339 may each have a thickness ranging from about 3 Angstroms to about 100 Angstroms.

In FIG. 3K, conductive features 340, 342 are formed in the openings 333, 335 (FIG. 3J), respectively, and a planarization process, such as a CMP process is performed. The conductive features 340, 342 may be formed by filling a conductive material in the openings 333, 335 (FIG. 3J). In some embodiments, the conductive features 340, 342 are both conductive vias. In some embodiments, the conductive features 340, 342 are both conductive lines. In some embodiments, the conductive feature 340 is a conductive via, and the conductive feature 342 is a conductive line, or vice versa. The conductive features 340, 342 may include any suitable conductive material, such as Cu, Ru, W, Ni, Al, Co, iridium (Ir), osmium (Os), gold (Au), palladium (Pd), platinum (Pt), silver (Ag), tantalum (Ta), titanium (Ti), or alloys thereof. In some embodiments, the conductive features 340, 342 include a conductive material that is chemically different than the first liner 339 and the conductive features 316, 317. In one exemplary embodiment, the conductive features 340, 342 include Cu. The conductive features 340, 342 may be deposited using PVD. CVD, ALD, electroplating, ELD, or other suitable deposition process, or combinations thereof, and followed by the planarization process. The interconnect structure 300 includes conductive features 340, 342 formed in the first dielectric layer 332. The conductive feature 340 may have a first dimension and the conductive feature 342 may have a second dimension greater than the first dimension. The conductive features 340, 342 are respectively in direct contact with the underlying first liner 339, which is in direct contact with the conductive features 316, 317 in the dielectric layer 314. Since the first liner 339 may include the same material as the conductive features 316, 317, the conductive features 340, 342 can be considered as being in direct contact with the conductive features 316, 317. The conductive features 340, 342 being in direct contact with the conductive features 316, 317 may have the lowest electrical resistance due to direct metal to metal contact. In addition, since there is no barrier layer between the conductive feature 340 and the conductive feature 316 nor the conductive feature 342 and the conductive feature 317, the contact resistance of the conductive features 340, 342 can be reduced.

In FIG. 3L, a first cap layer 344 is selectively formed on the conductive feature 340 and the conductive feature 342. The first cap layer 344 may further extend to cover the top surface of the first liner 339. In some alternative embodiments where the first barrier layer 338 and the first liner 339 include the same metals, the first cap layer 344 is also formed on the first barrier layer 338 and the first liner 339, as shown in FIG. 3L-1. In one exemplary embodiment, the first cap layer 344 is deposited to cover the top surfaces of the first liner 339, the conductive feature 340, and the conductive feature 342. The first cap layer 344 may be formed by any suitable process, such as CVD, ALD, or PVD. In some embodiments, the exposed surfaces of the first dielectric layer 332 may be first treated with a gas containing hydrophobic functional groups, and the hydrophobic functional groups are formed on the exposed surfaces of the first dielectric layer 332. The gas containing hydrophobic functional groups does not react with the metallic surfaces of conductive feature 340, the conductive feature 342, the first liner 339, and the first barrier layer 338. The hydrophobic functional groups formed on the exposed surfaces of the first dielectric layer 332 block the first cap layer 344 from forming on the first dielectric layer 332. In either case, the first cap layer 344 is selectively formed on the metallic surfaces of the conductive feature 340, the conductive feature 342, the first liner 339, and optionally the first barrier layer 338, and is not formed on the dielectric surfaces of the first dielectric layer 332.

In some embodiments, the first cap layer 344 includes the same material (e.g., Ru) as the first liner 339. In some embodiments, the first cap layer 344 includes the same material (e.g., Ru) as the first liner 339 and the conductive features 316, 317. The first cap layer 344 may include a material chemically different than the conductive features 340, 342. In some alternative embodiments, the first cap layer 344 includes a material chemically different than the first liner 339 or the conductive features 316, 317. For example, the first cap layer 344 may include a metal having relatively higher carbon solubility than the material of the first liner 339 or the conductive features 316, 317. In such cases, the first cap layer 344 may include or be made of Co, Ni, W, Mo, Ru, and the conductive features 340, 342 may include or be made of Cu.

In FIG. 3M, a second etch stop layer 346 is formed on the exposed surfaces of the first dielectric layer 332, the first cap layer 344, and the first barrier layer 338 (if not previously covered by the first cap layer 344). Then, a second dielectric layer 348 is formed on the second etch stop layer 346. The second etch stop layer 346 and the second dielectric layer 348 may include the same material as the first etch stop layer 330 and the first dielectric layer 332, respectively, and may be deposited using the same deposition technique as discussed above with respect to FIG. 3E. The second etch stop layer 346 is deposited to cover the exposed surfaces (e.g., top surface and sidewall surface) of the first cap layer 344. Therefore, the second etch stop layer 346 follows the profile of the first cap layer 344 and the first dielectric layer 332 to form a step-height over the first cap layers 344.

In FIG. 3N, openings 350, 352 are formed in and through the second dielectric layer 348 and the second etch stop layer 346 to expose a portion of the first cap layer 344. The opening 350 is disposed over the conductive feature 340, and the opening 352 is disposed over the conductive feature 342. The openings 350, 352 may be via or line openings and are intended to be filled with a conductive material to form conductive features therein. The openings 350, 352 may be formed by any suitable process, such as one or more etch processes. The etch processes remove a portion of the second dielectric layer 348 and the second etch stop layer 346 so that the openings 350, 352 each exposes a portion of a top surface of the corresponding first cap layer 344. In some embodiments, the openings 350, 352 are both via openings. The opening 350 and the opening 352 may have a diameter smaller than the diameter of the conductive features 340, 342, respectively.

After the openings 350, 352 are formed, a second barrier layer 354 and a second liner 356 are formed in the openings 350, 352. The second barrier layer 354 and the second liner 356 may be formed in a similar fashion as the first barrier layer 338 and the first liner 339 as discussed above with respect to FIGS. 3G-3J. The second liner 356 may include the same material as the first cap layer 344. The second barrier layer 354 may include the same material as the first barrier layer 338, and the second liner 356 may include the same material as the first liner 339. In some embodiments, the second liner 356 is a Co-free layer. In some embodiments, the second barrier layer 354 may include a material chemically different than the first barrier layer 338, and the second liner 356 may include a material chemically different than the first liner 339. In one embodiment, the second barrier layer 354 is TaN and the second liner 356 is Ru. In one exemplary embodiment, the second liner 356 is Ru, the first cap layer 344 is Ru, and the first liner 339 is Ru. In one exemplary embodiment, the second barrier layer 354 is TaN, the second liner 356 is Ru, the first cap layer 344 is Ru, the first barrier layer 338 is TaN, and the first liner 339 is Ru.

Figure 3O:
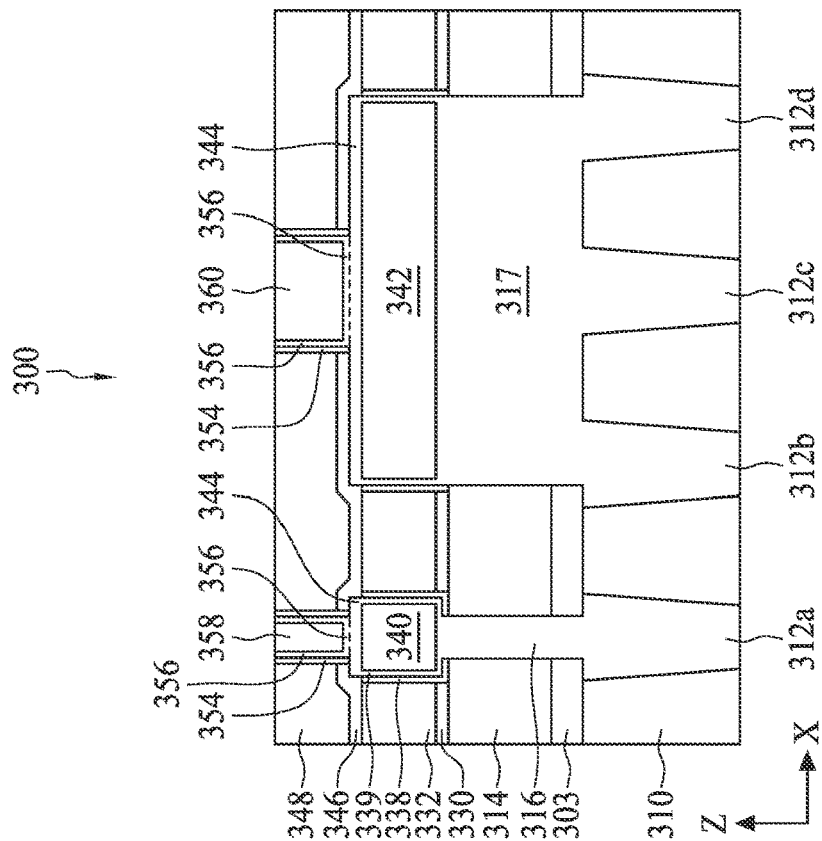

In FIG. 3O, conductive features 358, 360 are formed in the openings 350, 352 (FIG. 3N), respectively, and a planarization process, such as a CMP process is performed. The conductive features 358, 360 may be formed by filling a conductive material in the openings 350, 352, in a similar fashion as discussed above with respect to FIG. 3K. The conductive features 358, 360 may include the same material as the conductive features 340, 342, and may be deposited using the same deposition technique as the conductive features 340, 342. In one exemplary embodiment, the conductive features 358, 360 include Cu.

The interconnect structure 300 includes conductive features 358, 360 formed in the second dielectric layer 348. The conductive feature 358 may have a first dimension and the conductive feature 360 may have a second dimension greater than the first dimension. The conductive features 358, 360 are respectively in direct contact with the second liner 356, which is disposed on the first cap layer 344. Since the second liner 356 and the first cap layer 344 between the conductive features 358, 360 and the conductive features 340, 342 are both metal, the contact resistance of the conductive features 358, 360 is reduced.

In FIG. 3P, a second cap layer 362 is selectively formed on the conductive features 358, 360. In cases where the second barrier layer 354 and the second liner 356 include metals, the second cap layer 362 is also formed on the second barrier layer 354 and the second liner 356. In some embodiments, the second cap layer 362 is selectively formed on the metallic surfaces of the conductive features 358, 360, the second liner 356, and optionally the second barrier layer 254, and is not formed on the dielectric surfaces of the second dielectric layer 348. In one exemplary embodiment, the second cap layer 362 is deposited to cover the top surfaces of the second liner 356 and the conductive features 358, 360. The second cap layer 362 may be deposited in a similar fashion as the first cap layer 344 as discussed above. The second cap layer 362 may include a material chemically different than the second liner 356 and the conductive features 358, 360. In some embodiments, the second cap layer 362 includes the same material as the first cap layer 344. In some embodiments, the second cap layer 362 includes a material chemically different than the first cap layer 344. In one embodiment, the second cap layer 362 is Ru. In another embodiment, the second cap layer 362 is Co. In either case, the second barrier layer 354 may be TaN and the second liner 356 may be Ru. In one exemplary embodiment, the second cap layer is Co or Ru, the second liner 356 is Ru, the first cap layer 344 is Ru, and the first liner 339 is Ru. In one exemplary embodiment, the second cap layer is Co or Ru, the second barrier layer 354 is TaN, the second liner 356 is Ru, the first cap layer 344 is Ru, the first barrier layer 338 is TaN, and the first liner 339 is Ru.

It has been observed in traditional interconnect structures that when ruthenium is used for conductive features 312, 316, 317, and cobalt is used for the first cap layer 344, the first liner 339, and the second liners 356, material loss and thus void formation would occur at Co/Cu interfaces near the first cap layer 344 and conductive features 340, 342 due to Ru/Co intermixing at high temperature (e.g., about 300° C. or above) and Co depletion at M0/M1 interface. The use of pure ruthenium for all conductive features 312, 316, 317, the first and second liners 339, 356, and the first cap layer 344 creates no concentration gradient difference and minimized intrinsic incompatibility between the conductive features 340, 342 and the adjacent layers. As a result, the material (e.g., Co) in the first cap layer 344 is prevented from diffusing into and intermixing with Ru in the conductive features 316, 317 and/or the first and second liners 339, 356, thereby improving contact reliability of the interconnect structure 300. Particularly, no barrier layer is required between source/drain contact vias (e.g., conductive features 316, 317) and adjacent dielectric layers (e.g., dielectric layer 314) as well as the M0 contacts (e.g., conductive features 340, 342). In addition, since the conductive features 316, 317, the first and second liners 339, 356, and the first cap layer 344 all use Ru, rather than the heterogenous Ru/Co interface (high contact resistance) that is present in the traditional interconnect structures, the contact resistance at an interface of the conductive feature 340 and conductive feature 316 can be effectively reduced from, for example about 80 ohm to about 40-60 ohm, or from 32 ohm to about 12 ohm in some cases.

While only two IMD layers (e.g., first and second dielectric layers 332, 346) and conductive features (e.g., conductive features 340, 342, 358, 360) are shown and discussed, it is contemplated that more layers of IMD may be manufactured by repeating the processes discussed above with respect to FIGS. 3E-3P.

Figure 4:
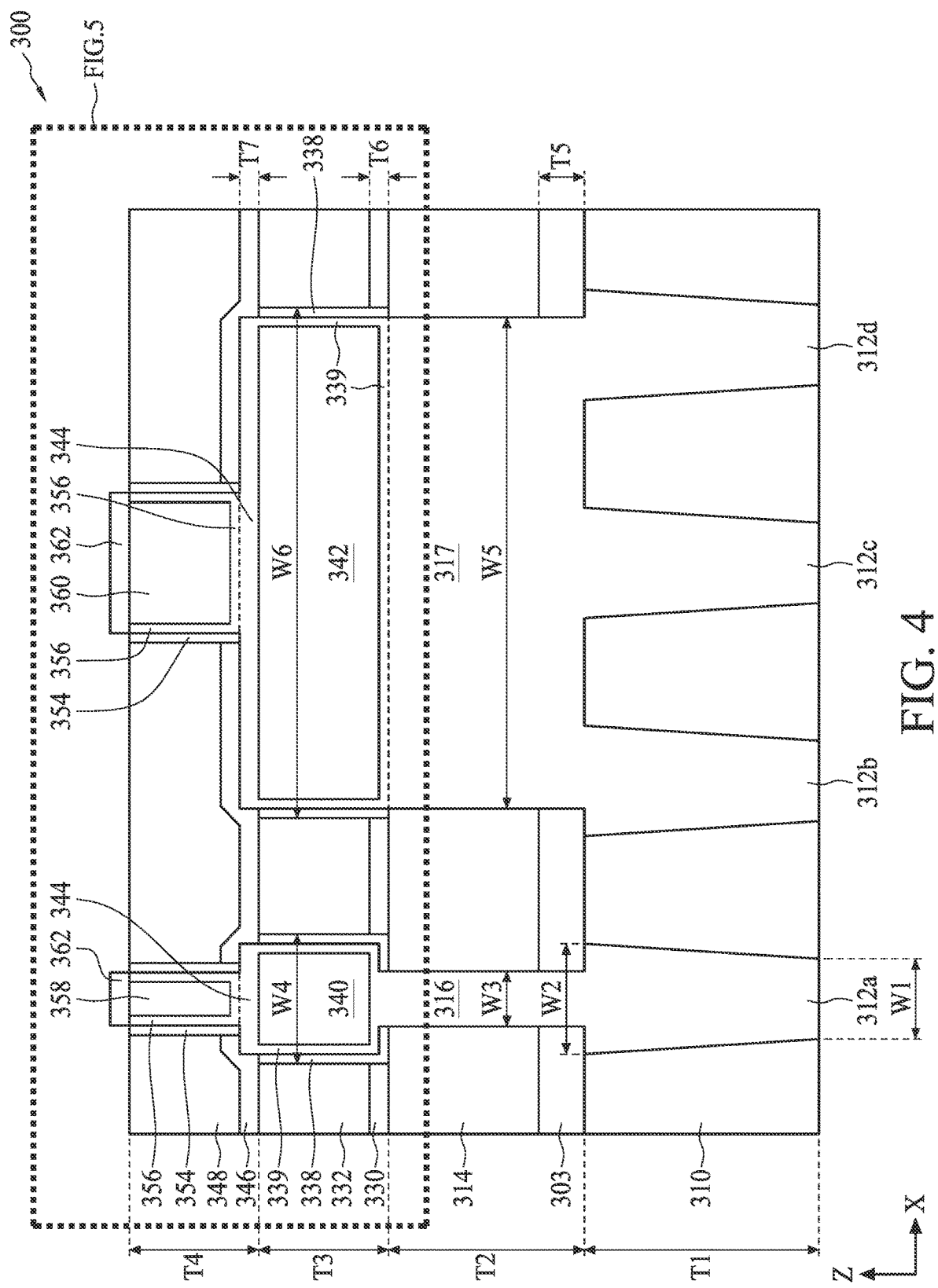
FIG. 4 illustrates a portion of the interconnect structure, in accordance with some embodiments.

FIG. 4 illustrates a portion of the interconnect structure 300 in accordance with some embodiments. The sidewalls of the conductive features 312, 316, 317, 340, 342, 358, 360 may be slanted or vertical. In some embodiments, the sidewalls of the conductive features 312 (e.g., conductive feature 312a) in the dielectric layer 310 are slanted, and the conductive features 316, 317, 340, 342, 358, and 360 may be substantially vertical. In such cases, the conductive features 312 may each have a sidewall profile in which the dimension is gradually decreased along the Z-direction. The dimension W2 at the top of each of the conductive feature 312 is greater than the dimension W1 at the bottom of the conductive feature 312. Depending on the application, the dimension W1 and the dimension W2 may be at a ratio (W1:W2) of about 1:1.2 to about 1:3. The conductive feature 316 above the conductive feature 312a may have a dimension W3, and the dimension W1 and the dimension W3 may be at a ratio (W1:W3) of about 1:1 to about 1:2. The conductive feature 340 above the conductive feature 316 may have a dimension W4, and the dimension W1 and the dimension W4 may be at a ratio (W1:W3) of about 1:1.25 to about 1:3. The dimension W3 is less than the dimension W1 and the dimension W4. The conductive feature 317 may have a dimension W5, and the dimension W1 and the dimension W5 may be at a ratio (W1:W5) of about 1:6 to about 1:20.

Depending on the application, the conductive feature 312 may have a height T1 and the conductive features 316, 317 may have a height T2. The height T1 and the height T2 may be at a ratio (T1:T2) of about 1:1 to about 1:0.8. The conductive features 340, 342 and the first liner 339 may have a combined height T3, and the conductive features 358, 360, the second liner 356, and the first cap layer 344 may have a combined height T4. The height T3 and the height T4 may be at a ratio (T3:T4) of about 1:1. The etch stop layer 303 may have a thickness T5, and the height T2 and the thickness T5 may be at a ratio (T2:T5) of about 1:0.6 to about 1:0.75. The first etch stop layer 330 may have a thickness T6, and the height T3 and the thickness T6 may be at a ratio (T3:T6) of about 1:0.6 to about 1:0.75. The second etch stop layer 348 may have a thickness T7, and the height T4 and the thickness T7 may be at a ratio (T4:T7) of about 1:0.6 to about 1:0.75.

Figure 5:
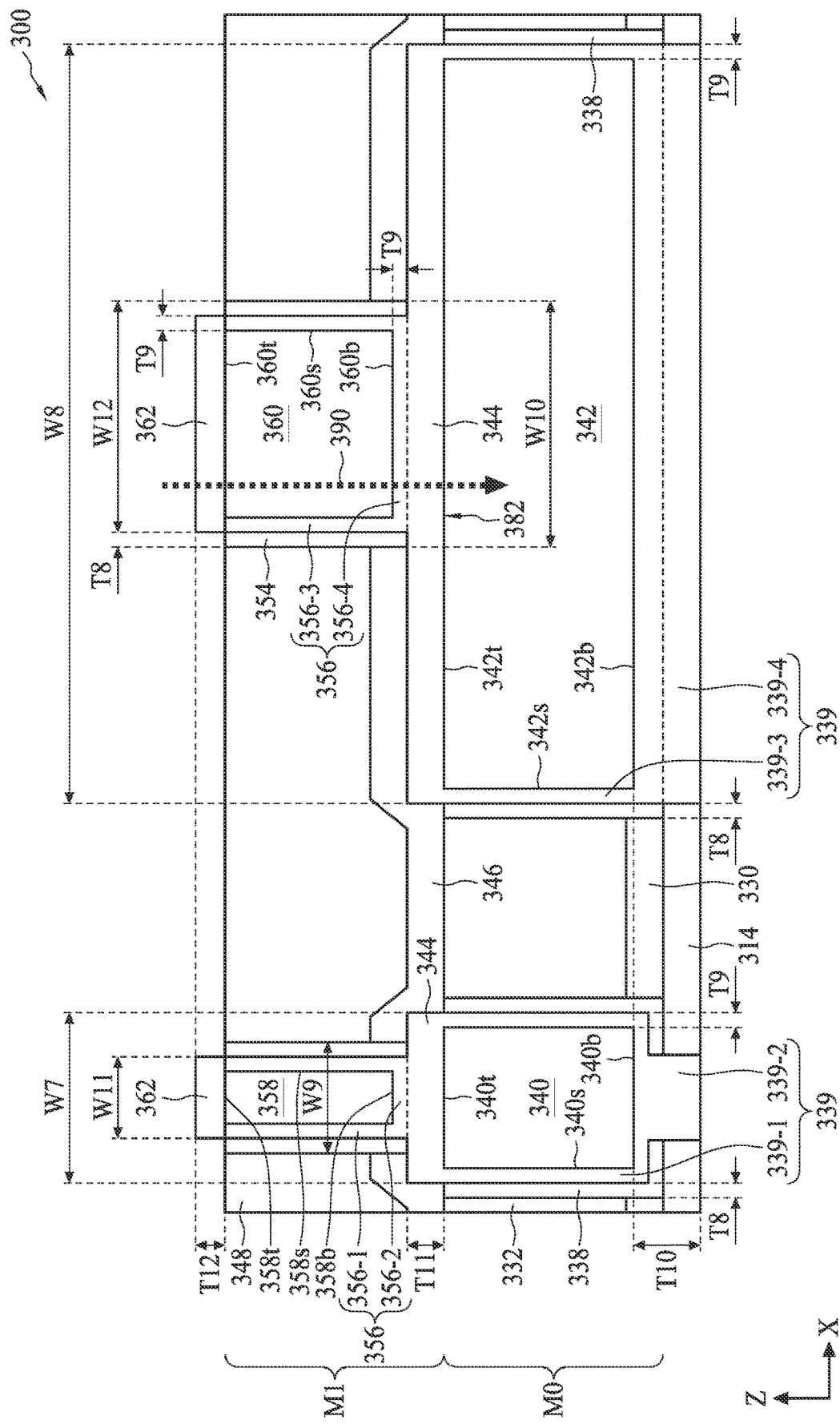
FIG. 5 illustrates an enlarged view of a portion of the interconnect structure showing intermetal dielectric (IMD) layers in accordance with some embodiments.

FIG. 5 illustrates an enlarged view of a portion of the interconnect structure 300 showing intermetal dielectric (IMD) layer (e.g., M0 and M1) in accordance with some embodiments. The first barrier layer 338 and the second barrier layer 354 may have a thickness T8, and the first liner 339 and the second liner 356 may have a thickness T9. The thickness T8 and the thickness T9 may be at a ratio (T8:T9) of about 1:1. In some embodiments, a portion of the first liner 339 in contact with a sidewall of the conductive feature 340 has the thickness T9 and a portion of the first liner 339 in contact with a bottom surface of the conductive feature 340 has a thickness T10 greater than the thickness T9. Likewise, a portion of the first liner 339 in contact with a sidewall of the conductive feature 342 has the thickness T9 and a portion of the first liner 339 in contact with a bottom surface of the conductive feature 342 has the thickness T10 greater than the thickness T9. The thickness T9 and the thickness T10 may be in a range of about 0.5 nm to about 4 nm. In some embodiments, the thickness T9 and the thickness T10 may be at a ratio (T9:T10) of about 1:2 to about 1:8. The first cap layer 344 may have a thickness T11, and the second cap layer 362 may have a thickness T12. The thickness T11 and the thickness T12 may be at a ratio (T11:T12) of about 1:1. The presence of the first cap layer 344 above the conductive features 340, 342 forms a protrusion that lifts up the second etch stop layer 346 accordingly in the area.

Depending on the application, the first cap layer 344 over the conductive feature 340 may have a width W7, and the first cap layer 344 over the conductive feature 342 may have a width W8 greater than the width W7. The width W7 and the width W8 may have a ratio (W7:W8) in a range of about 1:3 to about 1:35. The second cap layer 362 over the conductive feature 358 may have a width W11, and the second cap layer 362 over the conductive feature 360 may have a width W12 greater than the width W11. In cases where the second cap layer 362 extends to cover the top surface of the second liner 356, the width W11 and the width W12 may have a ratio (W11:W12) in a range of about 1:3 to about 1:30. The conductive feature 358, the second barrier layer 354, and the second liner 356 may have a combined width W9, and the conductive feature 360, the second barrier layer 354, and the second liner 356 may have a combined width W10 greater than the combined width W9. The width W9 and the width W10 may have a ratio (W9:W10) of about 1:3 to about 1:36.

The interconnect structure 300 in FIG. 5 shows conductive features (e.g., conductive vias) 340, 342 in the first dielectric layer 332 (e.g., M0) and conductive features (e.g., conductive vias) 358, 360 in the second dielectric layer 348 (e.g., M1) disposed over the first dielectric layer 332. The conductive feature 340 has a top surface 340t in contact with of the first cap layer 344 (e.g., Ru), a sidewall surface 340s in contact with a first part 339-1 of the first liner 339 (e.g., Ru), and a bottom surface 340b in contact with a second part 339-2 of the first liner 339. The second part 339-2 of the first liner 339 is about twice (or greater) in thickness than the first part 339-1 of the first liner 339. The second part 339-2 of the first liner 339 against the bottom surface 340b of the conductive feature 340 may have a substantially T-shaped profile. In some cases, a portion of the second part 339-2 is extended downwardly into the dielectric layer 314. Likewise, the conductive feature 342 has a top surface 342t in contact with of the first cap layer 344 (e.g., Ru), a sidewall surface 342s in contact with a third part 339-3 of the first liner 339 (e.g., Ru), and a bottom surface 342b in contact with a fourth part 339-4 of the first liner 339. The fourth part 339-4 of the first liner 339 is about twice (or greater) in thickness than the third part 339-3 of the first liner 339. The second part 339-2 of the first liner 339 against the bottom surface 340b of the conductive feature 340 may have a substantially rectangular-shaped profile. In some embodiments, the conductive features 340, 342 are completely surrounded or enclosed by the same conductive material (e.g., Ru) as the first liner 339 and the first cap layer 344.

The conductive features 358 has a top surface 358t in contact with of the second cap layer 362 (e.g., Co or Ru), a sidewall surface 358s in contact with a first part 356-1 of the second liner 356 (e.g., Ru), and a bottom surface 358b in contact with a second part 358-2 of the second liner 356 (e.g., Ru). Likewise, the conductive feature 360 has a top surface 360t in contact with of the second cap layer 362 (e.g., Co or Ru), a sidewall surface 360s in contact with a third part 356-3 of the second liner 356 (e.g., Ru), and a bottom surface 360b in contact with a fourth part 356-4 of the second liner 356 (e.g., Ru). The fourth part 356-4 of the second liner 356 is about the same in thickness as the third part 356-3 of the second liner 356. The first barrier layer 338 is disposed around the conductive feature 340 and in contact with the first part 339-1 of the first liner 339. The first barrier layer 338 is disposed around the conductive feature 342 and in contact with the third part 339-3 of the first liner 339. Likewise, the second barrier layer 354 is disposed around the conductive feature 358 and in contact with the first part 356-1 of the second liner 356. The second barrier layer 354 is disposed around the conductive feature 360 and in contact with the third part 356-3 of the second liner 356.

In some embodiments where the conductive feature 360 includes copper (Cu), the second liner 356 includes ruthenium (Ru), the first cap layer 344 includes Ru, and the conductive feature 342 includes Cu, the atomic percentage at. % of Cu may gradually change along a Z-direction 390 in these layers at a first Cu/Ru interface 380 and a second Cu/Ru interface 382. For example, the at. % of Cu may be gradually reduced from the first Cu/Ru interface 380 (e.g., at. % of Cu about 100 at. %) to the second Cu/Ru interface 382 (e.g., at. % of Cu about 0 at. %), while the at. % of Ru may be gradually increased from the first Cu/Ru interface 380 (e.g., at. % of Ru about 100 at. %) to the second Cu/Ru interface 382 (e.g., at. % of Ru about 0 at. %). In some embodiments, the first Cu/Ru interface 380 and second Cu/Ru interface 382 may each have a length of about 2 nm to about 7 nm.

Embodiments of this disclosure provide low-resistance interconnect structures by using ruthenium-based M0 liner (e.g., first liner 339), and ruthenium-based M1 selective capping (e.g., second cap layer 362) without cobalt to integrate with ruthenium-based source/drain contact vias (e.g., conductive features 316, 317). Since there is no M1/M0/via contact intermixing issue, a barrier thickness between source/drain contact vias and adjacent dielectric layers (e.g., dielectric layer 314) as well as the M0 contacts (e.g., conductive features 340, 342) can be reduced or even removed. The use of pure ruthenium for M1 selective capping (e.g., second cap layer 362), source/drain via contact caps (e.g., first cap layer 344), M0 ruthenium liner (e.g., first liner 339), ruthenium source/drain contact vias (e.g., conductive features 316) can effectively reduce the total interconnect resistance from 80 ohm to 40-60 ohm while preventing Ru and Co reliability issue due to Ru/Co intermixing at high temperatures.

In various embodiments, the improved interconnect structure may be manufactured by: (1) forming source/drain contacts through a first interlayer dielectric (ILD0) over respective source/drain features, wherein the source/drain contact may include a conductive material such as ruthenium (Ru); (2) subsequentially forming an etch stop layer and a second interlayer dielectric (ILD1) over the source/drain contacts; (3) forming first and second contact via openings through the ILD1 and the etch stop layer, wherein the first contact via opening exposes a top surface of one source/drain contact and the second contact via opening is formed to expose top surfaces of a plurality of source/drain contacts; (4) filling the first and second contact via openings with a conductive material such as ruthenium (Ru) to form first and second contact vias; (5) performing a CMP until the top surface of the ILD1 is exposed; (6) sequentially forming a first cap layer and a low-k dielectric; (6) forming first and second metal contact openings through the low-k dielectric and the first cap layer, wherein the first metal contact opening exposes a top surface of the first contact via and the second metal contact opening is formed to expose the entire top surface of the second contact via; (7) selectively forming a barrier layer on exposed sidewall surfaces of the first and second contact openings, wherein the barrier layer may include TaN; (8) forming a liner layer on the barrier layer and the top surfaces of the first and second contact vias, wherein the liner layer may include a conductive material such as ruthenium (Ru); (9) filling the first and second metal contact openings with a conductive material such as copper (Cu) to form first and second metal contacts, respectively; (10) performing a CMP until the top surface of the low-k dielectric is exposed; (11) selectively forming a second cap layer on the first and second metal contacts as well as the liner layer; and (12) repeating operations (6)-(11) to form third and fourth metal contacts directly above the first and second metal contacts.

An embodiment of an interconnect structure is provided. The interconnect structure includes a contact via in an interlayer dielectric, a first conductive feature in a first dielectric layer, the first dielectric layer being disposed over the interlayer dielectric. The interconnect structure also includes a first liner in the first dielectric layer, the first liner comprising a first part in contact with a sidewall surface of the first conductive feature, and a second part in contact with a bottom surface of the first conductive feature. The interconnect structure also includes a first cap layer in contact with a top surface of the first conductive feature, a second conductive feature in a second dielectric layer, the second dielectric layer being disposed over the first dielectric layer. The interconnect structure further includes a second liner in the second dielectric layer, wherein the first conductive feature and the second conductive feature comprises a first conductive material, and the contact via, the first liner, the first cap layer, and the second liner comprise a second conductive material that is chemically different than the first conductive material.

Another embodiment is a semiconductor device structure. The structure includes a first source/drain contact, a second source/drain contact, a third source/drain contact, and a fourth source/drain contact disposed in a first interlayer dielectric, a first conductive feature in a second interlayer dielectric, the first conductive feature being in direct contact with the second interlayer dielectric and the first source/drain contact, a second conductive feature in the second interlayer dielectric, the second conductive feature being in direct contact with the second interlayer dielectric, the second, third, and fourth source/drain contacts. The structure also includes a third conductive feature in a first dielectric layer, a fourth conductive feature in a second dielectric layer, the second dielectric layer being disposed over the first dielectric layer, a first liner in direct contact with a sidewall surface of the third conductive feature, a bottom surface of the third conductive feature, and a top surface of the first conductive feature. The structure further includes a second liner in direct contact with a sidewall surface of the fourth conductive feature and a bottom surface of the fourth conductive feature, wherein the first conductive feature, the second conductive feature, the first liner, and the second liner comprise a first conductive material, and the third conductive feature and the fourth conductive feature comprise a second conductive material that is chemically different than the first conductive material.

A further embodiment of a method for forming a semiconductor device structure is provided. The method includes forming a first conductive feature in an interlayer dielectric, the first conductive feature being in direct contact with the interlayer dielectric, wherein the first conductive feature comprises a first conductive material. The method also includes forming a first etch stop layer on the interlayer dielectric and the first conductive feature, forming a first dielectric layer on the first etch stop layer, forming an opening through the first dielectric layer and the first etch stop layer to expose a portion of the first conductive feature, selectively forming a first barrier layer on exposed surfaces of the first dielectric layer, the first etch stop layer, and the interlayer dielectric. The method also includes forming a first liner layer on the first barrier layer and exposed surface of the first conductive feature, wherein the first liner comprises the first conductive material. The method also includes filling the opening with a second conductive material to form a second conductive feature, the second conductive material being chemically different than the first conductive material, selectively forming a first cap layer on exposed surfaces of the second conductive feature, wherein the first cap layer comprises the first conductive material. The method also includes forming a second etch stop layer over the first dielectric layer, forming a second dielectric layer on the second etch stop layer, forming a third conductive feature through the second dielectric layer and the second etch stop layer, wherein the third conductive feature comprises the second conductive material. The method further includes selectively forming a second cap layer on exposed surface of the third conductive feature, wherein the second cap layer comprises the first conductive material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An interconnect structure, comprising:
 a contact via in an interlayer dielectric;
 a first conductive feature in a first dielectric layer, the first dielectric layer being disposed over the interlayer dielectric;
 a first liner in the first dielectric layer, the first liner comprising:
  a first part in contact with a sidewall surface of the first conductive feature; and
  a second part in contact with a bottom surface of the first conductive feature;
 a first cap layer in contact with a top surface of the first conductive feature;
 a second conductive feature in a second dielectric layer, the second dielectric layer being disposed over the first dielectric layer; and
 a second liner in the second dielectric layer,
 wherein the first conductive feature and the second conductive feature comprises a first conductive material, and the contact via, the first liner, the first cap layer, and the second liner comprise a second conductive material that is chemically different than the first conductive material.

2. The interconnect structure of claim 1, further comprising:
a second cap layer in contact with the second conductive feature.

3. The interconnect structure of claim 2, wherein the second cap layer comprises the second conductive material.

4. The interconnect structure of claim 3, wherein the second conductive material is ruthenium.

5. The interconnect structure of claim 3, wherein the second conductive material is cobalt-free.

6. The interconnect structure of claim 2, wherein the second cap layer comprises a third conductive material that is chemically different than the first and second conductive materials.

7. The interconnect structure of claim 6, wherein the third conductive material is cobalt.

8. The interconnect structure of claim 2, wherein the second cap layer is further in contact with the second liner.

9. The interconnect structure of claim 1, further comprising:
a first barrier layer in contact with the first dielectric layer and the first liner.

10. The interconnect structure of claim 9, further comprising:
a second barrier layer in contact with the second dielectric layer and the second liner.

11. The interconnect structure of claim 10, wherein the first barrier layer and the second barrier layer comprise a fourth conductive material.

12. The interconnect structure of claim 1, wherein a portion of the second part of the first liner is extended into the interlayer dielectric.

13. A semiconductor device structure, comprising:
a first source/drain contact, a second source/drain contact, a third source/drain contact, and a fourth source/drain contact disposed in a first interlayer dielectric;
a first conductive feature in a second interlayer dielectric, the first conductive feature being in direct contact with the second interlayer dielectric and the first source/drain contact;
a second conductive feature in the second interlayer dielectric, the second conductive feature being in direct contact with the second interlayer dielectric, the second, third, and fourth source/drain contacts;
a third conductive feature in a first dielectric layer;
a fourth conductive feature in a second dielectric layer, the second dielectric layer being disposed over the first dielectric layer;
a first liner in direct contact with a sidewall surface of the third conductive feature, a bottom surface of the third conductive feature, and a top surface of the first conductive feature; and
a second liner in direct contact with a sidewall surface of the fourth conductive feature and a bottom surface of the fourth conductive feature,
wherein the first conductive feature, the second conductive feature, the first liner, and the second liner comprise a first conductive material, and the third conductive feature and the fourth conductive feature comprise a second conductive material that is chemically different than the first conductive material.

14. The semiconductor device structure of claim 13, further comprising:
a first barrier layer disposed between and in contact with the first dielectric layer and the first liner; and
a second barrier layer disposed between and in contact with the second dielectric layer and the second liner.

15. The semiconductor device structure of claim 13, further comprising:
a first cap layer disposed between and in contact with a top surface of the third conductive feature and the second liner.

16. The semiconductor device structure of claim 15, further comprising:
a second cap layer in contact with top surfaces of the fourth conductive feature and the second liner.

17. The semiconductor device structure of claim 16, wherein the second cap layer comprises the first conductive material.

18. The semiconductor device structure of claim 15, further comprising:
a fifth conductive feature in the first dielectric layer; and
a third liner disposed in the first dielectric layer and in contact with the second conductive feature and a sidewall surface of the fifth conductive feature, and a bottom surface of the fifth conductive feature.

19. A method for forming a semiconductor device structure, comprising:
forming a first conductive feature in an interlayer dielectric, the first conductive feature being in direct contact with the interlayer dielectric, and the first conductive feature comprising a first conductive material;
forming a first etch stop layer on the interlayer dielectric and the first conductive feature;
forming a first dielectric layer on the first etch stop layer;
forming an opening through the first dielectric layer and the first etch stop layer to expose a portion of the first conductive feature;
selectively forming a first barrier layer on exposed surfaces of the first dielectric layer, the first etch stop layer, and the interlayer dielectric;
forming a first liner layer on the first barrier layer and exposed surface of the first conductive feature, the first liner comprising the first conductive material;
filling the opening with a second conductive material to form a second conductive feature, the second conductive material being chemically different than the first conductive material;
selectively forming a first cap layer on exposed surfaces of the second conductive feature, the first cap layer comprising the first conductive material;
forming a second etch stop layer over the first dielectric layer;
forming a second dielectric layer on the second etch stop layer;
forming a third conductive feature through the second dielectric layer and the second etch stop layer, the third conductive feature comprising the second conductive material; and
selectively forming a second cap layer on exposed surface of the third conductive feature, the second cap layer comprising the first conductive material.

20. The method of claim 19, further comprising:
providing a second liner layer in the second dielectric layer, the second liner layer being in contact with a sidewall surface and a bottom surface of the third conductive feature; and providing a second barrier layer in the second dielectric layer, the second dielectric layer being disposed between and in contact with the second dielectric layer and the second liner layer.

\* \* \* \* \*